US010854266B1

(12) United States Patent
Di Vincenzo et al.

(10) Patent No.: US 10,854,266 B1
(45) Date of Patent: *Dec. 1, 2020

(54) FULL BIAS SENSING IN A MEMORY ARRAY

(71) Applicant: Micron Technology, Inc., Boise, ID (US)

(72) Inventors: Umberto Di Vincenzo, Capriate San Gervasio (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/523,404

(22) Filed: Jul. 26, 2019

Related U.S. Application Data

(63) Continuation of application No. 16/030,590, filed on Jul. 9, 2018, now Pat. No. 10,395,717, which is a
(Continued)

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01)

(58) Field of Classification Search
CPC ............... G11C 11/2273; G11C 11/221; G11C 11/2255
(Continued)

(56) References Cited

U.S. PATENT DOCUMENTS

| 5,381,364 A | 1/1995 | Chern et al. |
| 6,084,795 A | 7/2000 | Nunokawa |

(Continued)

FOREIGN PATENT DOCUMENTS

| JP | 2006164368 A | 6/2006 |
| JP | 2007035157 A | 2/2007 |

(Continued)

OTHER PUBLICATIONS

ISA/KR, International Search Report and Written Opinion of the International Searching Authority, Int'l Appl. No. PCT/US2017/047991, dated Nov. 29, 2017, Korean Intellectual Property Office, Seo-gu-Daejon, Republic of Korea, 12 pgs.
(Continued)

*Primary Examiner* — Fernando Hidalgo
(74) *Attorney, Agent, or Firm* — Holland & Hart LLP

(57) ABSTRACT

Methods, systems, and apparatuses for full bias sensing in a memory array are described. Various embodiments of an access operation of a cell in a array may be timed to allow residual charge of a middle electrode between the cell and a selection component to discharge. Access operations may also be timed to allow residual charge of middle electrodes associated with other cells to be discharged. In conjunction with an access operation for a target cell, a residual charge of a middle electrode of another cell may be discharged, and the target cell may then be accessed. A capacitor in electronic communication with a cell may be charged and a logic state of the cell determined based on the charge of the capacitor. The timing for charging the capacitor may be related to the time for discharging a middle electrode of the cell or another cell.

19 Claims, 12 Drawing Sheets

Related U.S. Application Data continuation of application No. 15/246,249, filed on Aug. 24, 2016, now Pat. No. 10,049,713.

(58) Field of Classification Search
USPC .......................................................... 365/145
See application file for complete search history.

(56) References Cited

U.S. PATENT DOCUMENTS

| | | | |
|---|---|---|---|
| 6,459,609 B1* | 10/2002 | Du | G11C 11/22 |
| | | | 365/145 |
| 6,525,956 B2 | 2/2003 | Murakuki | |
| 7,233,536 B2 | 6/2007 | Ogiwara et al. | |
| 7,254,061 B2 | 8/2007 | Nam et al. | |
| 7,366,039 B2 | 4/2008 | Kang et al. | |
| 7,460,390 B2 | 12/2008 | Yamamura | |
| 7,480,183 B2 | 1/2009 | Mori | |
| 7,529,115 B2 | 5/2009 | Yamamura | |
| 7,561,458 B2 | 7/2009 | Madan | |
| 7,593,257 B2 | 9/2009 | Murayama et al. | |
| 8,760,907 B2* | 6/2014 | Evans, Jr. | G11C 11/221 |
| | | | 365/145 |
| 9,123,430 B2 | 9/2015 | Cernea | |
| 2007/0139993 A1 | 6/2007 | Yamamura | |
| 2008/0008007 A1 | 1/2008 | Mori | |
| 2008/0055960 A1* | 3/2008 | Morita | G11C 11/22 |
| | | | 365/145 |
| 2008/0144351 A1 | 6/2008 | Eliason et al. | |
| 2008/0219038 A1 | 9/2008 | Shuto | |
| 2015/0341023 A1 | 11/2015 | Kushnarenko et al. | |
| 2017/0256299 A1 | 9/2017 | Toops | |
| 2018/0122478 A1 | 5/2018 | Morris et al. | |

FOREIGN PATENT DOCUMENTS

| | | |
|---|---|---|
| JP | 2007172711 A | 7/2007 |
| JP | 2010118128 A | 5/2010 |

OTHER PUBLICATIONS

Supplementary European Search Report, European Appl. No. 17844273.7, dated Mar. 17, 2020, European Patent Office, 80298 Munich, Germany, 8 pgs.

Japanese Patent Office, "Office Action", issued in connection with Japanese Patent Application No. 2019-510433, dated Aug. 4, 2020 (17 pages, with translation).

\* cited by examiner

FULL BIAS SENSING IN A MEMORY ARRAY

CROSS REFERENCE

The present Application for Patent is a continuation of U.S. patent application Ser. No. 16/030,590 by Di Vincenzo et al., entitled "Full Bias Sensing in a Memory Array," filed Jul. 9, 2018, which is a continuation of U.S. patent application Ser. No. 15/246,249 by Di Vincenzo et al., entitled "Full Bias Sensing in a Memory Array," filed Aug. 24, 2016, assigned to the assignee hereof, and each of which is expressly incorporated by reference in its entirety herein.

BACKGROUND

The following relates generally to memory devices and more specifically to full bias sensing in a memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Repeated access operations along a common conductive line may cause unwanted charges to build up on any number of memory cells connected to the common conductive line.

BRIEF DESCRIPTION OF THE DRAWINGS

The disclosure herein refers to and includes the following figures.

DETAILED DESCRIPTION

Figure 1:
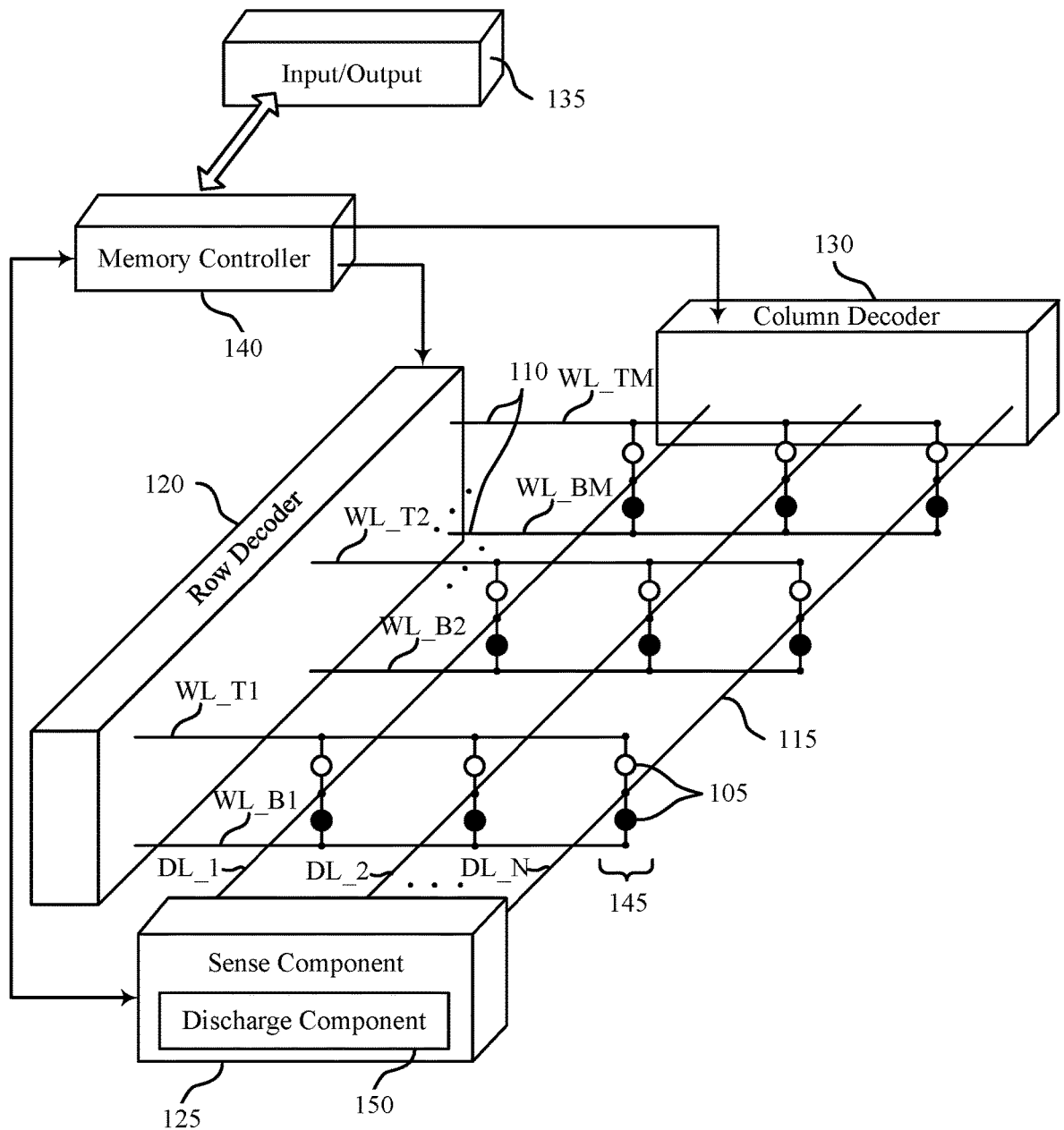
FIG. 1 illustrates an example of a memory array that supports full bias sensing in a memory array in accordance with embodiments of the present disclosure.

When performing an access operation on a targeted memory cell, residual charges present in the array may contribute to a signal on a common conductive line and may affect the reliability of the signal. For example, during a read operation, the residual charges may contribute to the signal output by the targeted memory cell and may cause the memory array to misinterpret the charge on the targeted memory cell. To correct for these and other errors that may be introduced by residual charges, the steps of an access operation may be timed to allow the residual charges to dissipate or discharge. The array may also include components (e.g., switches, capacitors, latches, etc.) arranged to facilitate access operations and mitigate issues caused by residual charge. For example, switches, such as transistors, which may also be referred to as switching components, may be arranged and operated to discharge the residual charges from the common conductive line and from the memory cells prior to performing an access operation on the targeted memory cell.

By way of example, some memory architectures may have multiple memory cells connected to a common conductive line (e.g., access line, row line, word line, column line, digit line, bit line, etc.). A memory cell may exist at the intersection of two such common conductive lines, and each memory cell may be accessed by activating its two respective conductive lines. A memory array with this type of configuration may be referred to as a cross-point array or a cross-point architecture. The memory cells may include or be coupled with a two-terminal selection component, where the selection component may be integrated with the memory cell between the two conductive lines.

A memory cell may be accessed when both its conductive lines are energized. The memory cell being accessed may be referred to as a target or targeted memory cell. In some memory architectures, including three-dimensional cross-point architectures, however, repeatedly accessing the same common conductive line may disturb one or more memory cells in electronic communication with that conductive line—e.g., cells connected to the conductive line, such as a column or row line, other than the targeted cell may be disturbed by the access operation on the target memory cell. For example, performing an access operation on the targeted memory cell may cause charge to build up within the middle electrodes of the other, untargeted memory cells, creating a non-zero voltage. As used herein, the middle electrode of a memory cell may refer to the portion of the memory cell or terminal positioned between a storage device of the memory cell, such as a capacitor, and a selection component of the memory cell. Residual charges may also build up on the common conductive line.

During an access operation of the targeted memory cell, the common conductive line is energized, which may cause the residual charges present on the common conductive line and the connected memory cells to discharge. The residual charges present on the memory cells and the common conductive line may be large enough to disrupt or corrupt the signal of the targeted memory cell during an access operation. In such situations, an error may be introduced into the data read from or written to the cell. For example, such a discharge of the residual charges may cause the residual charges to provide unwanted contributions to the signal being read from the targeted memory cell. To compensate for or mitigate this effect, the residual charges stored on the middle electrode of the memory cells may be discharged prior to performing the access operation or during an initial portion of the access operation on the targeted memory cell.

As disclosed herein, devices and methods to discharge the residual charges prior to performing an access operation on a targeted memory cell are presented. A plurality of switching components may be positioned in the memory array. The plurality of switching components may be configured to energize a common conductive line prior to performing an access operation on the targeted memory cell. During this initial energization, the residual charges may be discharged or dissipated from the conductive line and the middle electrodes of the memory cells associated with the common conductive line. After a first time period has elapsed, the switching components may be configured to connect the targeted memory cell to a sense capacitor. During a second time period following the first time period, the sense capacitor may be charged by the capacitor of the targeted memory cell so that the charge of the sense capacitor is indicative of the logic state of the targeted memory cell. After the second time period has elapsed, the switching components may be configured to disconnect the sense capacitor from the selected memory cell and connect the sense capacitor to a latch. During a third time period, the latch may be configured to determine the logic state of the selected memory cell based at least in part on the charge present on the sense capacitor.

The devices and methods described herein may provide a number of benefits and advantages. For example, they may provide for a full bias implementation that increases or improves the available signal from the ferroelectric memory cell such that it produces a full remnant polarization by accounting for the undesired residual charges. A described herein, a low-voltage latch may employed for a read operation, which may allow for reduced power consumption or better performance (e.g., gain or mismatch) compared with higher-voltage deployments. The techniques described herein may also allow for sensing that avoids or mitigates issues due to residual charge without exceedingly complex refresh or write-back scheme, and the techniques may be employed on a device that uses the area of a die more efficiently other disturb-mitigation techniques.

Features of the disclosure introduced above are further described below in the context of a memory array. Specific examples are then described for discharging residual charges present on a common conductive line and on associated memory cells prior to performing an access operation on a targeted cell. These and other features of the disclosure are further illustrated by and described with reference to apparatus diagrams, system diagrams, and flowcharts that relate to full bias sensing in a memory array.

FIG. 1 illustrates an example memory array 100 that supports full bias sensing in a memory array in accordance with various embodiments of the present disclosure. In the illustrative example of FIG. 1, the memory array 100 is a three-dimensional memory array. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric material as the dielectric material. Different levels of charge of a ferroelectric capacitor may represent different logic states. Ferroelectric materials have non-linear polarization properties. The memory cells 105 may be ferroelectric memory cells, and some details and advantages of a ferroelectric memory cells are discussed below.

Memory array 100 may be a three-dimensional (3D) memory array, where two or more two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. In other embodiments (not shown), the memory array 100 may be a single level memory, e.g., a two-dimensional memory array.

Operations such as reading and writing, which may be referred to as access operations, may be performed on memory cells 105 by activating or selecting the appropriate combination of common conductive lines, such as, for example, word line 110 and digit line 115. Word lines 110 may also be referred to as access lines or row lines and digit lines 115 may also be referred to as bit lines or column lines. References to word lines and bit lines, or their analogues, are interchangeable without loss of understanding or operation. Word lines 110 and bit lines 115 may be perpendicular (or nearly perpendicular) to one another to create an array.

As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. The upper memory cells 105 may be referred to as a top deck and the lower memory cells 105 may be referred to as a bottom deck. Other configurations may be possible; for example, a third layer may share a word line 110 with a lower layer. In general, one memory cell 105 may be located at the intersection of two conductive lines, such as a word line 110 and a digit line 115. This intersection may be referred to as a memory cell's address. A target memory cell 105 may be a memory cell 105 located at the intersection of an energized word line 110 and digit line 115; that is, a word line 110 and digit line 115 may be energized in order to read or write a memory cell 105 at their intersection. Other memory cells 105 that are in electronic communication with (e.g., connected to) the same word line 110 or digit line 115 may be referred to as untargeted memory cells.

Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address; the appropriate word line 110 may be the word line 110 associated with the deck that includes a target memory cell 105, as discussed below. Similarly, a column decoder 130 receives a column address from the memory controller 140 and activates the appropriate digit line 115. For example, memory array 100 may include multiple word lines 110, labeled WL_T1 through WL_TM for the top deck of the illustrative array and WL_B1 through WL_BM for the bottom deck of the illustrative array, and multiple digit lines 115, labeled DL_1 through DL_N, where M and N depend on the array size. Thus, by activating a word line 110 and a digit line 115, e.g., WL_T2 and DL_2, the memory cell 105 of the top deck at their intersection may be accessed. By activating, for example, WL_B2 and DL_2, the memory cell 105 of the bottom deck at their intersection may be accessed, Upon accessing, a memory cell 105, which may have a ferroelectric capacitor, may be read, or sensed, by sense component 125 to determine the stored logic state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

Sense component 125 may include various transistors or amplifiers in order to detect and amplify a difference in the signals, which may be referred to as latching. The detected logic state of memory cell 105 may then be output through column decoder 130 as input/output 135. In the illustrative example, the sense component 125 includes a discharge circuit 150. The discharge circuit 150 may include any arrangement of switches, capacitors, and other electronic components configured to discharge one or more residual charges from the digit line 115 and other memory cells 105 associated with the digit line 115, prior to performing an access operation on the targeted memory cell. Elements or components of the discharge circuit 150 may be collocated with sense component 125 located, physically close to one another, or may be distributed throughout memory array 100. Sense component 125 may operate at a lower voltage than other components of memory array 100. For example, sense component 125 may be or include a low voltage latch.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating the memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
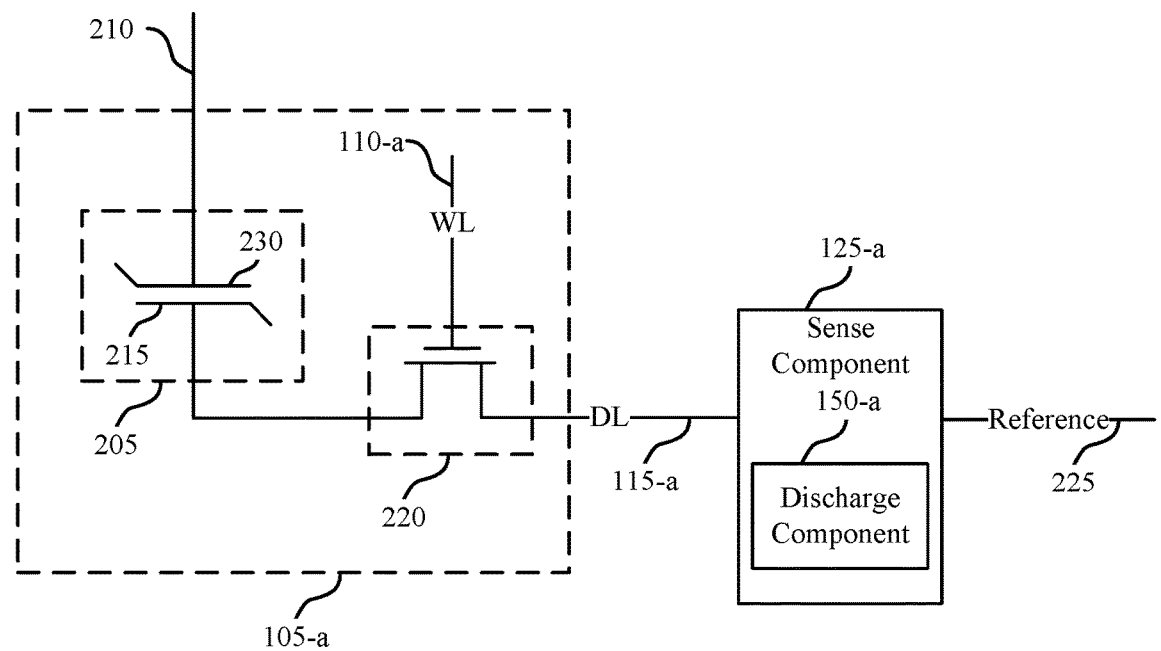
FIG. 2 illustrates an example of a memory array that supports full bias sensing in a memory array in accordance with embodiments of the present disclosure.

FIG. 2 illustrates an example circuit 200 that supports full bias sensing in a memory array in accordance with various embodiments of the present disclosure. Circuit 200 includes a memory cell 105-a, word line 110-a, digit line 115-a, sense component 125-a, and discharge circuit 150-a, which may be examples of a memory cell 105, word line 110, digit line 115, sense component 125, and discharge circuit 150, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging the capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting a memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, connecting the capacitor 205 with the digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by the ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as input/output 135 with reference to FIG. 1. In addition, the sense component 125-*a* may also include discharge circuit 150-*a* to discharge residual charges prior to performing an access operation on a targeted memory cell. The discharge circuit 150-*a* may include various transistors, amplifiers, capacitors, voltage sources, or other electronic components to perform the functions described herein.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
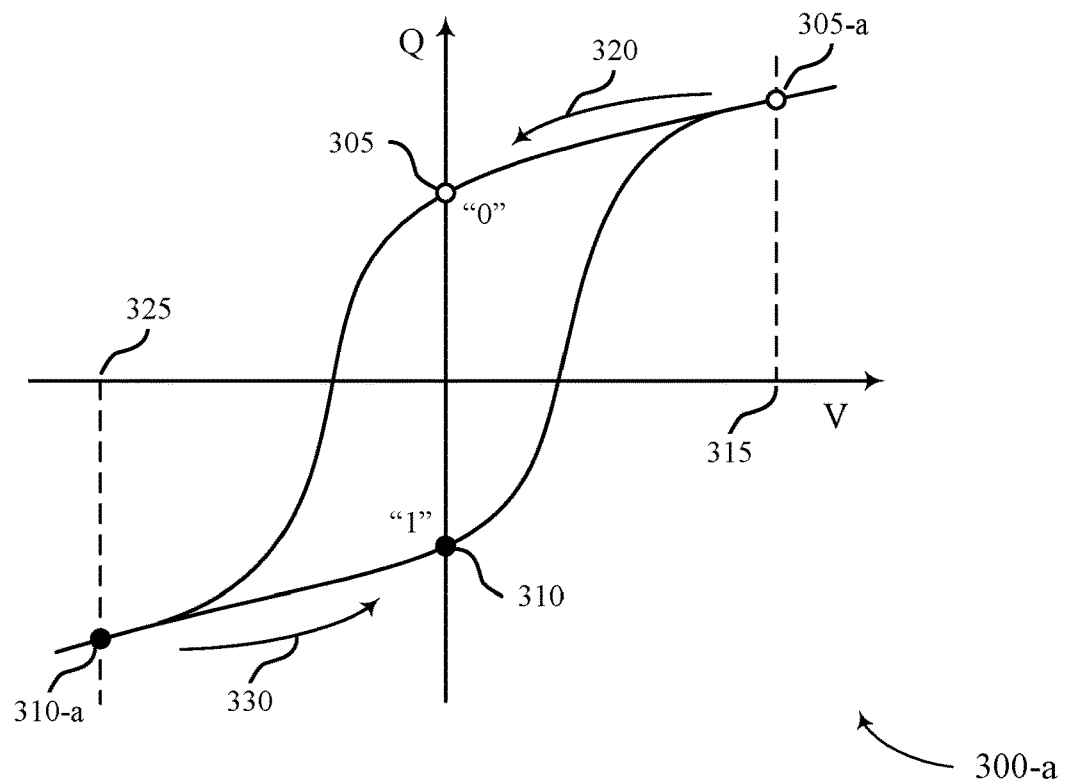
FIG. 3 illustrates examples of hysteresis plots for a ferroelectric memory cell that supports full bias sensing in a memory array in accordance with embodiments of the present disclosure.
Figure 3:
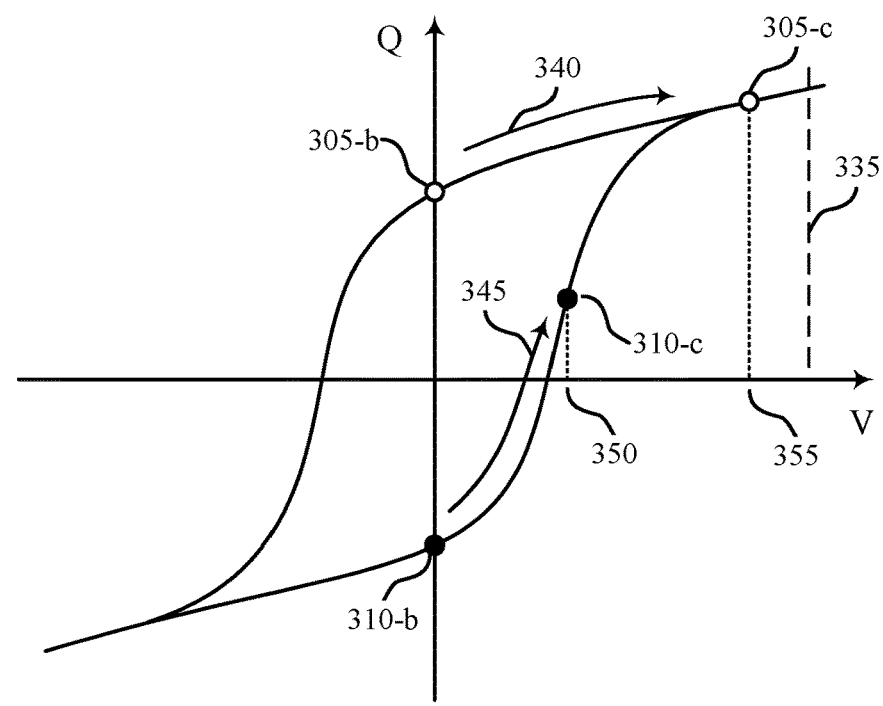

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing the voltage 315, charge state 305-*a* follows path 320 until it reaches charge state 305 at zero voltage potential. Similarly, charge state 310 is written by applying a net negative voltage 325, which results in charge state 310-*a*. After removing the negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, the hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on the hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335–voltage 350) or (voltage 335–voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335–voltage 350) and (voltage 335–voltage 355). Upon comparison by the sense component, the sensed digit line voltage may be determined to be higher or lower than the reference voltage, and the stored logic value of the ferroelectric memory cell (i.e., a logic 0 or 1) may be determined. By mitigating the effects of residual charges that may be stored on the common conductive line and memory cells associated with the common conductive line, more charge may be extracted from the targeted memory cell. Because more charge is extracted, the voltage difference from the targeted cell may be greater, making it less likely that an error will be introduced during an access operation. Without accounting for the residual charges stored on the middle electrodes of the memory cells, the charge extracted from the targeted cell may be less than it would be otherwise.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
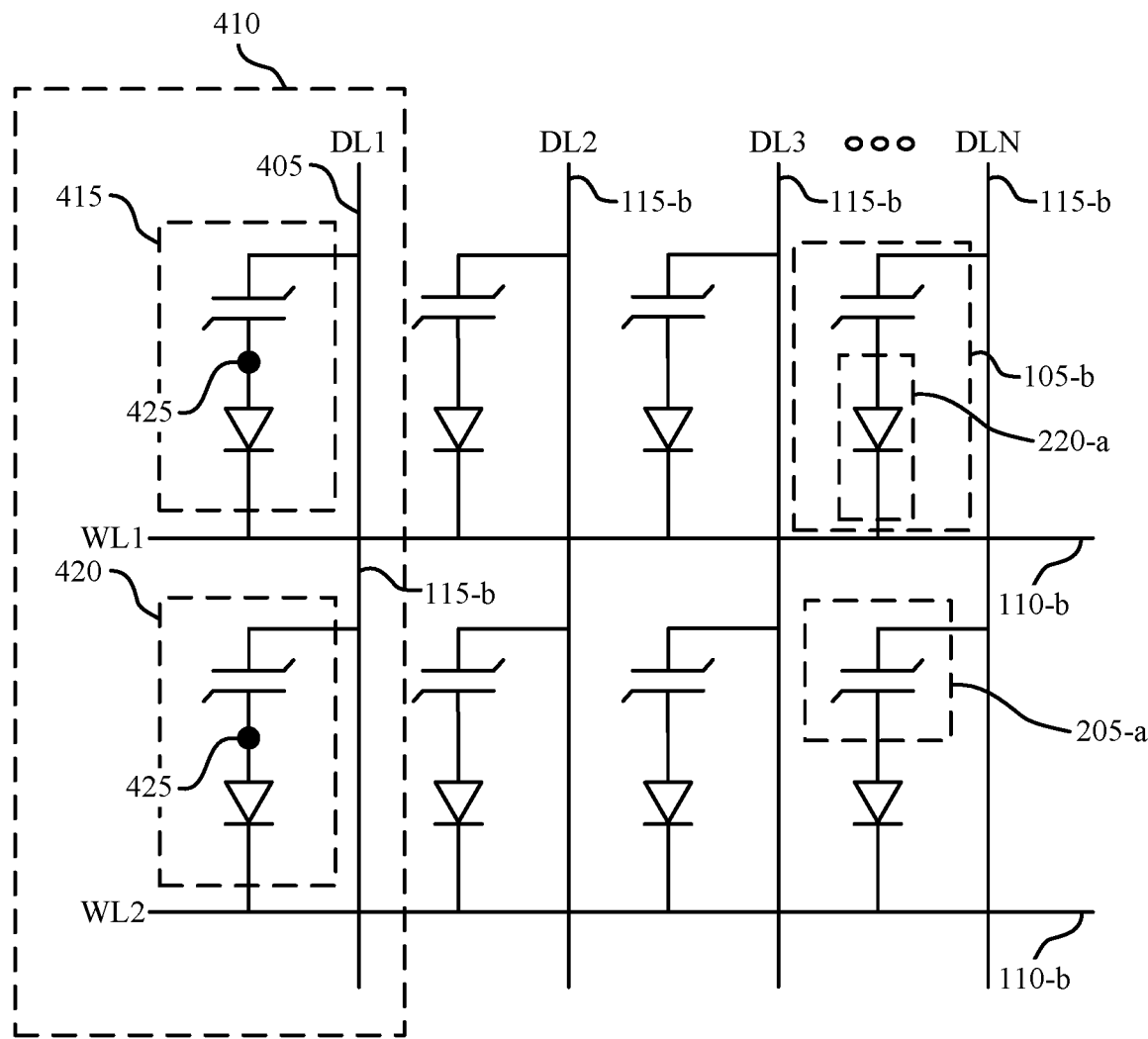
FIG. 4 illustrates an example of a memory array that supports full bias sensing in a memory array in accordance with embodiments of the present disclosure.

FIG. 4 shows an illustrative example of a memory array 400 that supports full bias sensing in a memory array in accordance with various embodiments of the present disclosure. Memory array 400 may be an example of embodiments of the memory array 100 as described with reference to FIG. 1. The memory array 400 may include a ferroelectric memory cell 105-b, a plurality of word lines 110-b, and a plurality of digit lines 115-b. The memory array 400 shows a common conductive line 405 (e.g., a digit line 115-b) and a memory cell group 410 connected to the common conductive line 405. At least one of the memory cells of the group 410 is a targeted memory cell 415 and the remaining memory cells of the group 410 are untargeted memory cells 420. Each memory cell 105-b of the memory array 100 includes a ferroelectric capacitor 205-a and a selection component 220-a. In the illustrative example of FIG. 4, the selection component 220-a may be embodied as a two-way diode. The two-way diode may conduct current in a first direction if a first voltage difference exceeds a first threshold between the two terminals of the two-way diode, and it may conduct current in a second direction if a second voltage difference exceeds a second threshold between the two terminals of the two-way diode.

Because of high-impedances of the ferroelectric capacitor 205-a and the selection component 220-a, relative to other components in the memory array 400 or in other architectures, the portion of the memory cell between the ferroelectric capacitor 205-a and the selection component 220-a may be capable of storing a charge. The portion of the memory cell between the ferroelectric capacitor 205-a and the selection component 220-a is sometimes called a middle electrode 425.

During an access operation of the targeted memory cell 415, the middle electrodes 425 of the untargeted memory cells 420 may store a residual charge based on the voltage applied to the common conductive line 405 during the access operation. Later, during another access operation, the residual charges stored in their respective middle electrodes 425 of any of the memory cells 105-b of the group 410 may contribute to the signal on the common conductive line 405 and produce errors in the signal. For example, during a read operation, the residual charges may contribute to the signal being output by the targeted memory cell 415 during the read operation. If the contributions are large enough, the memory array 100 may misinterpret the signal being read from the targeted memory cell 415.

Figure 5:
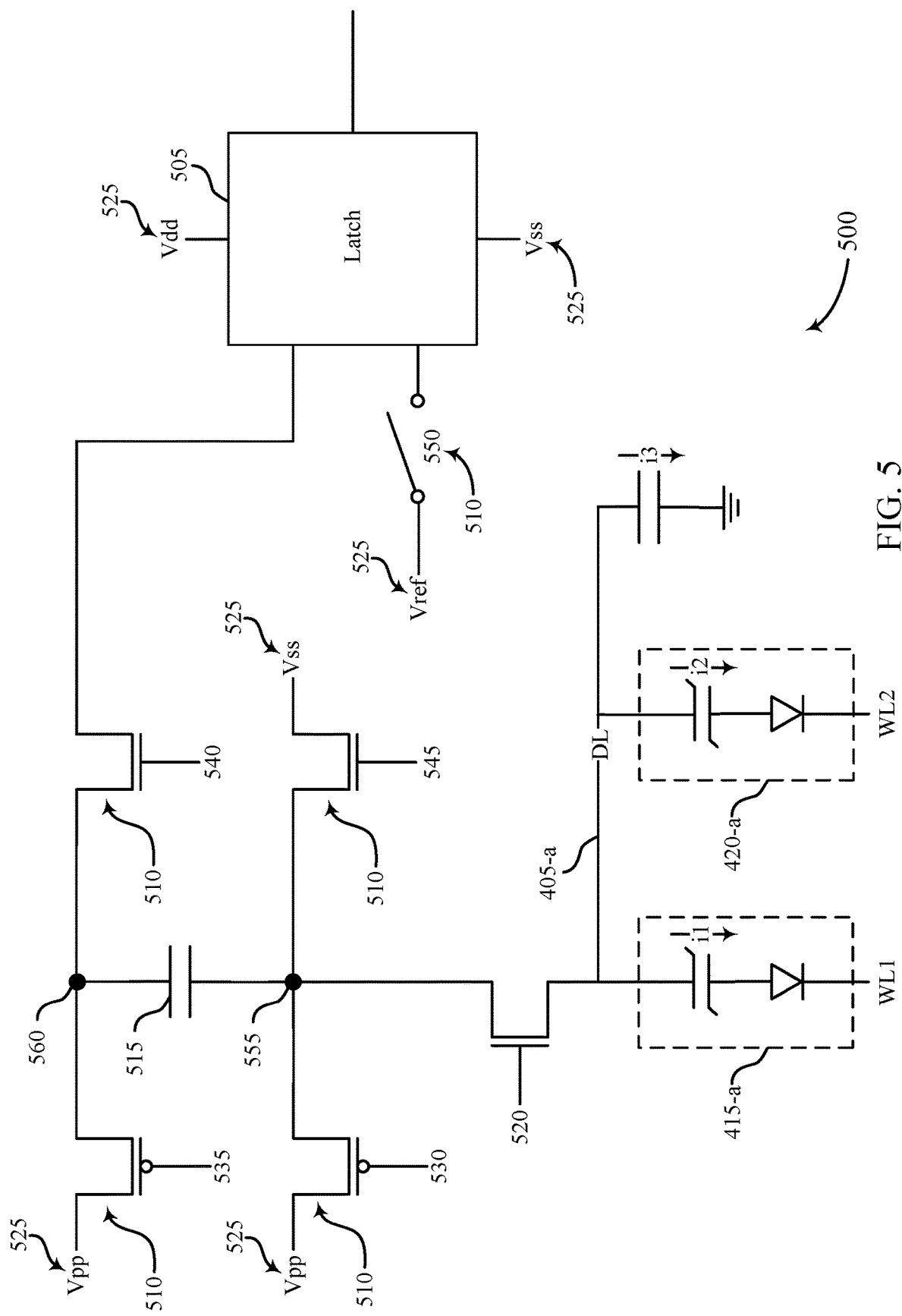
FIG. 5 shows an example of an implementation of a discharge circuit that supports full bias sensing in a memory array in accordance with embodiments of the present disclosure.

FIG. 5 illustrates an example of a discharge circuit 500 for full bias sensing in a memory array. Discharge circuit 500 may be an example of discharge circuit 150 described with referent to the preceding figures. The discharge circuit 500 may be positioned between a targeted memory cell 415-a and a latch 505. In some examples, the discharge circuit 500 is configured to discharge the residual charges that may be present on a common conductive line 405-a (e.g., digit line) and the associated group 410 of memory cells prior to performing an access operation on the targeted memory cell 415-a.

The discharge circuit 500 may include a plurality of switching components 510, at least one capacitor (e.g., sense capacitor 515), an amplifier 520, and a plurality of voltage sources 525 (e.g., Vdd, Vss, etc.). The plurality of switching components 510, the sense capacitor 515, the amplifier 520, and the voltage sources 525 are configured to discharge the residual charges associated with the common conductive line 405-a (e.g., residual charge stored on the middle electrode 425 of the memory cells 105 and the residual charge that may be stored on the common conductive line 405 itself), transfer the charge stored on the targeted memory cell 415-a to the sense capacitor 515, present a representation of the charge on the sense capacitor 515 to the latch 505, and determine the logic state of the targeted memory cell 415-a. In the illustrative embodiment, the discharge circuit 500 uses higher-voltage voltage sources than the latch 505.

The plurality of switching components 510 may be any type of switch capable of being operated by an input voltage. For example, a switching component 510 may be a transistor, which performs an action depending on whether a gate voltage of the transistor exceeds a certain threshold. In other examples, a switching component 510 may be another type of electronic switch, such as a toggle switch. The switching components 510 of discharge circuit 500 include a first switching component 530, a second switching component 535, a third switching component 540, a fourth switching component 545, and a fifth switching component 550. The specific switch components are configured to selectively couple, electronically, electronic components together. For example, first switching component 530 is configured to selectively couple a first terminal 555 of the sense capacitor 515 to a first voltage source Vpp. In other example, the second switching component 535 is configured to selectively couple a second terminal 560 of the sense capacitor 515 to the first voltage source Vpp. The gate voltages of the switching components 510 of the discharge circuit 500 may be controlled by a controller of a memory device, such as the memory controllers 140, 1415, 1515 shown a described in FIGS. 1, 14, and 15. The memory controllers 140, 1415, 1515 may also control the memory array 100 (e.g., control the access operations) and the latch 505. Switching components 510 may be coupled to the sense capacitor 515 and a first voltage supply and be in electronic communication with the targeted memory cell 415-a.

The sense capacitor 515 may be any type of electronic component capable of storing a charge such as, for example, a capacitor. In some examples, the sense capacitor 515 is configured to receive a charge from the targeted memory cell 415-a of the memory array. The sense capacitor 515 may be in electronic communication with the targeted memory cell 415-a via the common conductive line 405-a. In some cases, the sense capacitor 515 comprises a first terminal 555 coupled to the common conductive line 405-a and to the first voltage supply via a first switching component 530 and a second terminal 560 coupled to the first voltage supply via a second switching component 535. In some cases, the second terminal 560 is coupled to the latch 505 via the third switching component. In some cases, the second terminal 560 of the sense capacitor 515 is in electronic communication with the latch 505. The targeted ferroelectric memory cell 415-a may be in electronic communication with the common conductive line 405-a (e.g., a digit line 115).

The amplifier 520 may be a cascode amplifying device. The amplifier is positioned between the common conductive line 405-a and the other electronic components of the discharge circuit 500. The amplifier 520 is configured to amplify a signal sent by the targeted memory cell 415-a during a read operation. The amplifier 520 may be positioned between the targeted memory cell 415-a and the sense capacitor 515, wherein the amplifier 520 is configured to amplify an output signal of the targeted memory cell 415-a. In some cases, the amplifier 520 comprises a cascode.

The latch 505 may be a low-voltage latch capable of determining the logic state of the targeted memory cell 415-a based at least in part on the charge stored on the sense capacitor 515. In the illustrative embodiment, the low-voltage latch operates using a lower voltage than the discharge circuit 500. For example, the low-voltage latch may operate using around 1 volt. Latch 505 may be in electronic communication with the sense capacitor 515 and coupled with a second voltage supply that is lower than the first voltage supply.

FIGS. 6-9 show a number of graphical representations 600, 700, 800, 900 of voltages and currents as functions of time and may represent operations on the memory array 100 depicted in preceding figures. Each of the graphical representations 600, 700, 800, 900 includes a timing diagram and are plotted over the same time period. In some examples, the discharge circuit 500 (or other components of a memory array 100) performs an access operation using three time periods. During a first time period (from t0 to t1), one or more residual charges may be discharged from the common conductive line 405-a and its associated memory cells 415-a, 420-a. During a second time period (from t1 to t2), the charge stored on the targeted memory cell 415-a may be transferred to the sense capacitor 515. During a third time period from (t2 to t3), the voltage present on sense capacitor 515 may be applied to the latch 505. Finally, at t4, a logic state of the targeted memory cell 415-a may be determined (e.g., at or with latch 505) by comparing the voltage received from the sense capacitor 515 to a reference voltage. The functions and operations of the memory array 100 represented by the graphical representations 600, 700, 800, 900 may be controlled by the memory controllers 140, 1415, 1515.

Figure 6:
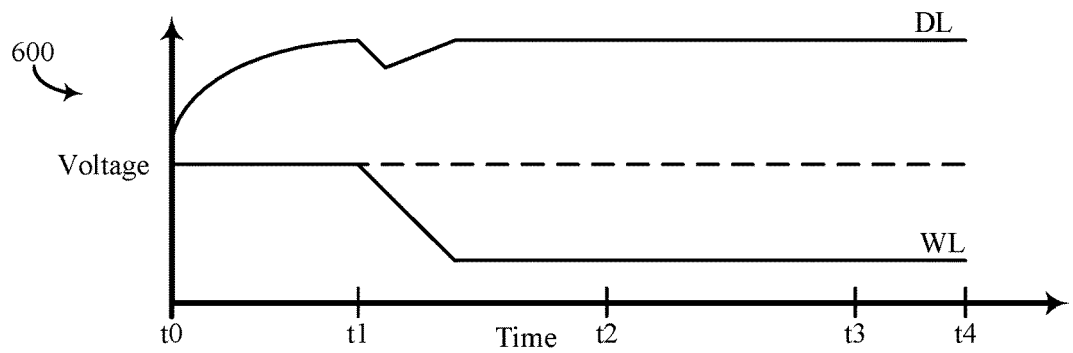
FIG. 6 shows an example of a time plot of voltages on a first common conductive line and a second common conductive line of a targeted memory cell in accordance with embodiments of the present disclosure.

FIG. 6 shows a graphical representation 600 of voltages on a first common conductive line and a second common conductive line of a targeted memory cell during an access operation using the discharge circuit 500 shown in FIG. 5. During the first time period (t0-t1) a voltage may be applied to the digit line of the a memory block. At t1, a voltage of one or more word lines associated with the digit line may be adjusted. In this way one of the memory cells associated with the digit line is selected as the targeted memory cell 415-a. In the illustrative example, the voltage across the word line is reduced. In this way, the voltage difference across the targeted ferroelectric memory cell 415-a is greater and the logic state of targeted memory cell may be read, changed, or in some other way affected.

Figure 7:
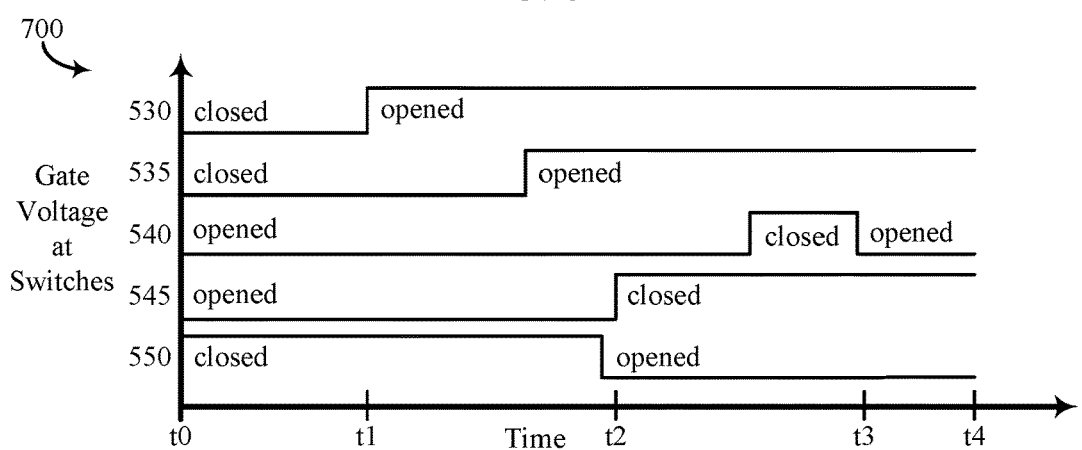
FIG. 7 shows an example of a time plot of gate voltages at a plurality of switching components in accordance with embodiments of the present disclosure.

FIG. 7 shows a graphical representation 700 of the gate voltages at each of the switching components 510 of the discharge circuit 500 shown in FIG. 5. In the illustrative embodiment, these gate voltages are controlled by the memory controller 140. In other embodiments, the gate voltages may be controlled by another controller or computing device. The graphical representation 700 depicts when particular switches are open and when they are closed during an access operation of the targeted memory cell 415-a. As used in graphical representation 700, the term "closed" means that the switch is allowing its conductive line to conduct electricity and the term "opened" means that the switch is not allowing its conductive to conduct electricity.

Figure 8:
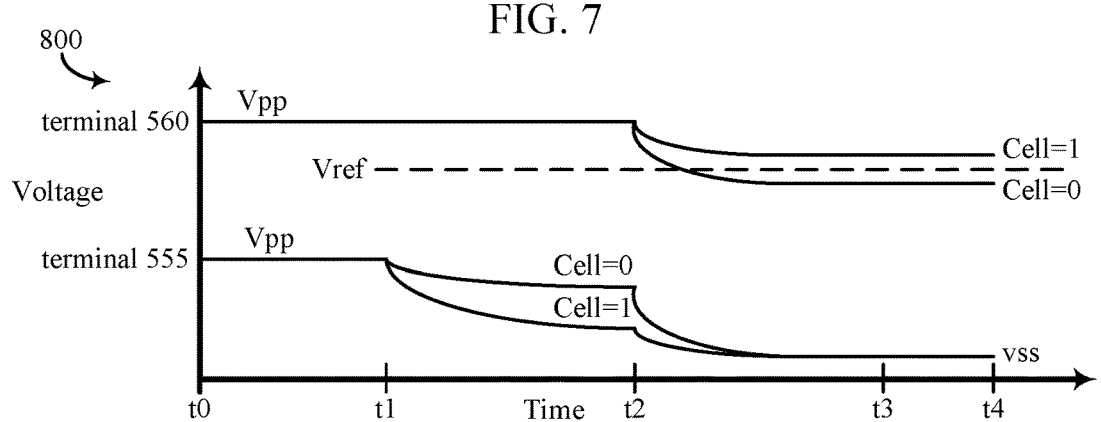
FIG. 8 shows an example of a time plot of voltages at terminals of a capacitor in accordance with embodiments of the present disclosure.
Figure 9:
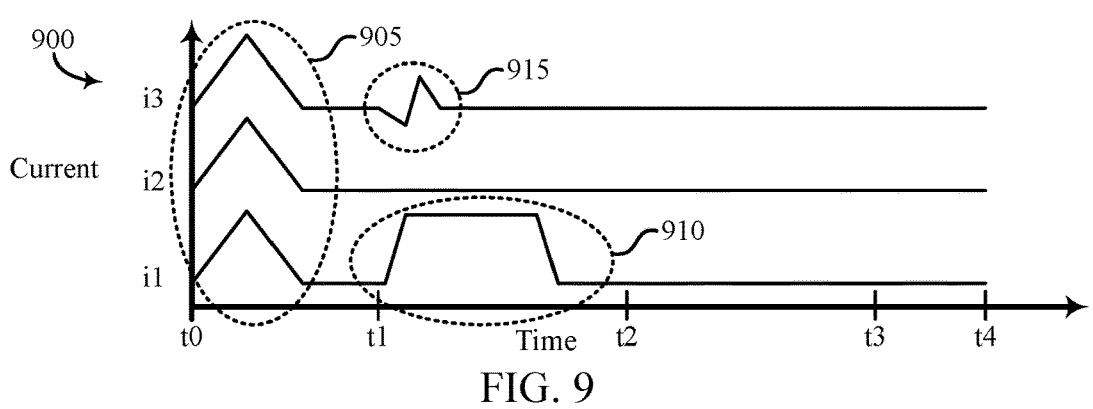
FIG. 9 shows an example of a time plot of currents in accordance with embodiments of the present disclosure.

As already discussed, various functions of an access operation are performed during a number of different time periods. The specific operations of the switching components and other electronic components during each of the before-mentioned time periods will be described referring to FIGS. 7, 8, and 9. FIG. 7 specifically refers to the operation of the plurality of switching components 510 of the discharge circuit 500. FIGS. 8 and 9 depict some results of operating those switching components. Consequently, FIGS. 8 and 9 are introduced here, but used elsewhere to describe the results of opening and closing certain switching components. FIG. 8 shows a graphical representation 800 of voltages at terminals of the sense capacitor 515 shown in FIG. 5. FIG. 9 shows a graphical representation 900 of currents shown in FIG. 5.

During the first time period (t0-t1), the first switching component 530, the second switching component 535, and the fifth switching component 550 are closed and the third switching component 540 and the fourth switching component 545 are opened. The first switching component 530 connects the common conductive line 405-a to the first voltage source Vpp. By applying the first voltage source Vpp to the common conductive line 405-a (e.g., digit line 115-c), a number of currents represented by i1, i2, and i3 are induced along the common conductive line 405-a and in the memory cells 415-a, 420-a associated with the common conductive line 405-a. As shown in FIG. 9, the region 905 of the graphical representation 900 depicts the residual charges being dissipated and/or discharged by the application of a voltage to the common conductive line 405-a. In addition, the second switching component 535 connects the second terminal 560 of the sense capacitor 515 to the first voltage source Vpp. As shown in FIG. 8, because both the first terminal 555 and the second terminal 560 are connected to the first voltage source Vpp, the sense capacitor 515 has a voltage level determined by Vpp.

As shown in FIG. 7, during the second time period (t1-t2), starting at t1, the first switching component 530 is changed to an opened position. In this way, the voltage applied to the common conductive line 405-a is removed and the process of charging the sense capacitor 515 based on the charge of the targeted memory cell 415-a begins. As described earlier with relation to FIG. 6, at t1, the voltage at a word line is adjusted such that one of the memory cells 105-b is chosen as the targeted memory cell 415-a. As shown in FIG. 9, the region 910 of the graphical representation 900 represents the targeted memory cell 415-a discharging its charge into the sense capacitor 515. In addition, the region 915 of the graphical representation 900 represents changes in the current on the digit line 115 after the voltage on the word line 110 is adjusted at t2, as shown and described in FIG. 6. As shown in FIG. 8, the voltage at terminal 560 stays steady at Vpp while the voltage at the first terminal 555 changes according to the charge present on targeted memory cell 415-a. At some time between t1 and t2, the second switching component 535 is changed to an opened position. At such a time, the transfer of charge from the targeted memory cell 415-a to the sense capacitor 515 may begin to stop.

As shown in FIG. 7, during the third time period (t2-t3), at t2, the fourth switching component 545 is changed to a closed position. This connects the first terminal 555 of the sense capacitor 515 to a second voltage Vss. This virtually grounds the first terminal 555 the sense capacitor 515. Just before t3, the fifth switching component 550 is changed to an opened position, thereby removing the reference voltage from the latch 505. During the third time period, the second terminal 560 of the sense capacitor 515 is left floating. Consequently, no current will flow across the sense capacitor 515 and the sense capacitor 515 will maintain its charge. As shown in FIG. 8, because the sense capacitor 515 maintains its charge, the first terminal 555 will adjust to Vss (e.g., a virtual ground) and the second terminal 560 will compensate and adjust to a voltage indicative of the charge present on the sense capacitor 515. As should be appreciated, the charge present on the sense capacitor 515 is based at least in part on the charge present on the targeted memory cell 415-a. The reference voltage (Vref) applied to the latch 505 is selected such that it may discriminate between logic states of the targeted memory cell 415-a. More specifically, Vref will be selected to be less than a first voltage associated with a first logic state (e.g., cell=1) and will be selected to more than a second voltage associated with a second logic state (e.g., cell=0). In other embodiments, the memory cell may support more than two distinct logic states and Vref may be selected differently, or even there may be more than one Vref. Sometime between t2 and t3, the third switching component 540 is changed to a closed position. In this way, the second terminal 560 of the sense capacitor 515 is applied to the latch 505. Just before t3, the third switching component 540 is changed back to the opened position. In this way, the latch 505 senses the voltage on the second terminal 560 that is useful to determine the logic state of the targeted memory cell 415-a.

While not shown in FIGS. 6-9, at t4, the latch 505 may be activated. Once activated the latch 505 stores the voltage seen at the second terminal 560, compares that voltage to Vref, and determines the logic state of the targeted memory cell 415-a.

Figure 10:
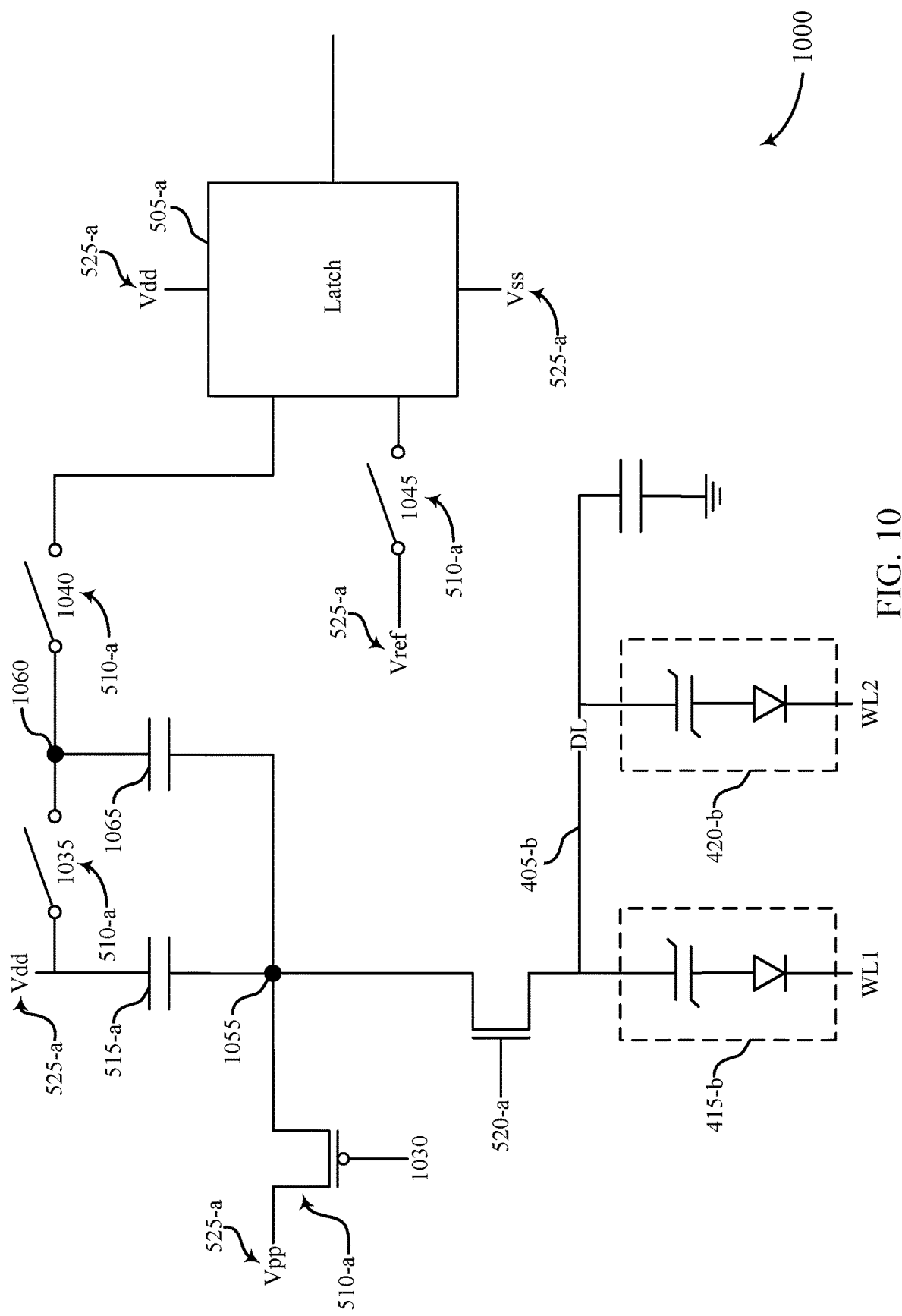
FIG. 10 shows an example of another implementation of a discharge circuit that supports full bias sensing in a memory array in accordance with embodiments of the present disclosure.

FIG. 10 illustrates another example of a discharge circuit 1000 for full bias sensing in a memory array. In some cases, the discharge circuit 1000 may be embodied as an example of discharge circuit 150. The discharge circuit 1000 includes many of the same elements and features as the discharge circuit 500 described above. Elements of the discharge circuit 1000 having similar numbering to elements of discharge circuit 500 may be similarly embodied. As such, full descriptions of these common elements are not repeated here.

Like the discharge circuit 500, the discharge circuit 1000 is positioned between a targeted memory cell 415-b and a latch 505-a. The discharge circuit 1000 is configured to discharge the residual charges that may be present on a common conductive line 405-b (e.g., digit line) and associated memory cells prior to performing an access operation on the targeted memory cell 415-b (e.g., a read operation).

The discharge circuit 1000 may include a plurality of switching components 510-a, a sense capacitor 515-a, an amplifier 520-a, a plurality of voltage sources 525-a, and a shift capacitor 1065. As discussed above, the electronic components 510-a, 515-a, 520-a, 525-a, and the shift capacitor 1065 are configured to discharge the residual charges associated with the common conductive line 405-b (e.g., residual charge stored on the middle electrode 425 of the memory cells 105 and the residual charge that may be stored on the common conductive line 405 itself), transfer the charge stored on the targeted memory cell 415-b to the sense capacitor 515-a, present a representation of the charge on the sense capacitor 515-a to the latch 505-a, and determine the logic state of the targeted memory cell 415-b. In the illustrative embodiment, the discharge circuit 1000 uses higher-voltage sources than the latch 505-a.

The shift capacitor 1065 is configured to shift the voltage output by the sense capacitor 515-a to a different value when the latch 505-a is reading the voltage on the sense capacitor 515-a. In the illustrative embodiment, the shift capacitor is configured to shift the output voltage received by the latch 505-a from a first voltage level (Vpp) to a second voltage level (Vdd). The shift in output voltage seen at the latch 505-a may provide a better functioning latch by ensuring that the output voltage is at an appropriate level for the latch 505-a. Because of the addition of the shift capacitor 1065, the discharge circuit 1000 includes several features and details that are different than the discharge circuit 500. The basic elements being used in the discharge circuit 1000 are similarly embodied as the elements of the discharge circuit 500 (e.g., the switching components 510-a are similarly embodied to the switching components 510). The shift capacitor 1065 may be embodied as any type of electronic component capable of storing a charge such as, for example, a capacitor. The shift capacitor 1065 is connected to the sense capacitor 515-a and the common conductive line 405-b at a first terminal 1055. The shift capacitor 1065 is selectively coupled to the latch 505-a and the sense capacitor 515-a at a second terminal 1060. The shift capacitor 1065 may be in electronic communication with the common conductive line 405-b (e.g., the digit line 115) and the sense capacitor 515-a, wherein the shift capacitor 1065 is in electronic communication with the latch 505-a that is coupled with a second voltage supply that is lower than the first voltage supply. In some cases, the shift capacitor 1065 comprises a first terminal 1055 coupled with the common conductive line 405-b and a second terminal 1060 of the shift capacitor 1065 is coupled with the first voltage supply via another switching component.

Figure 11:
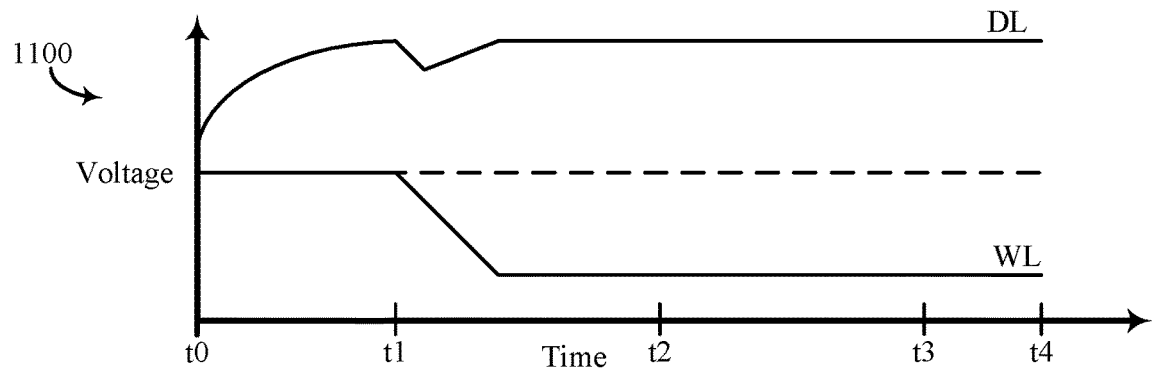
FIG. 11 shows an illustrative example of a time plot of voltages in accordance with embodiments of the present disclosure.
Figure 12:
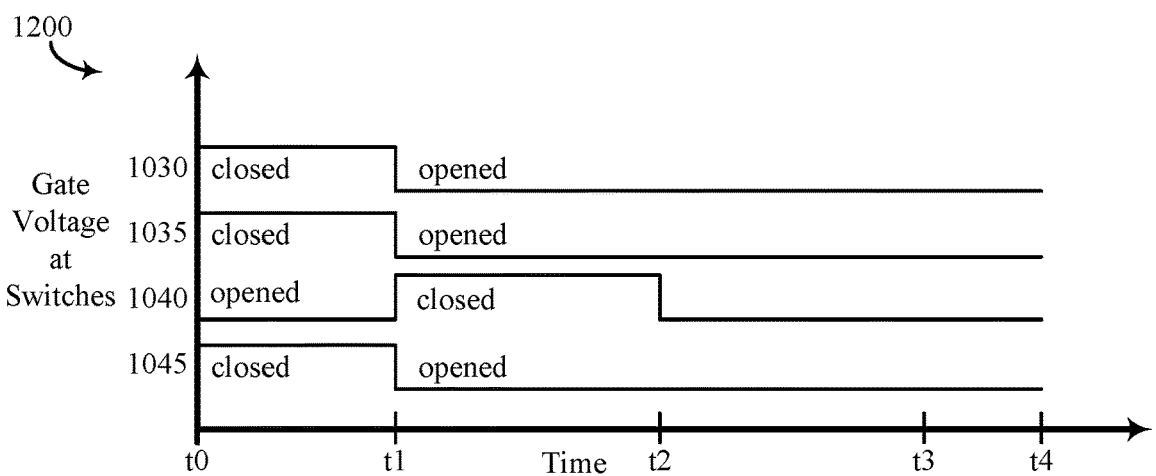
FIG. 12 shows an illustrative example of a time plot of gate voltages at a plurality of switching components 10 in accordance with embodiments of the present disclosure.
Figure 13:
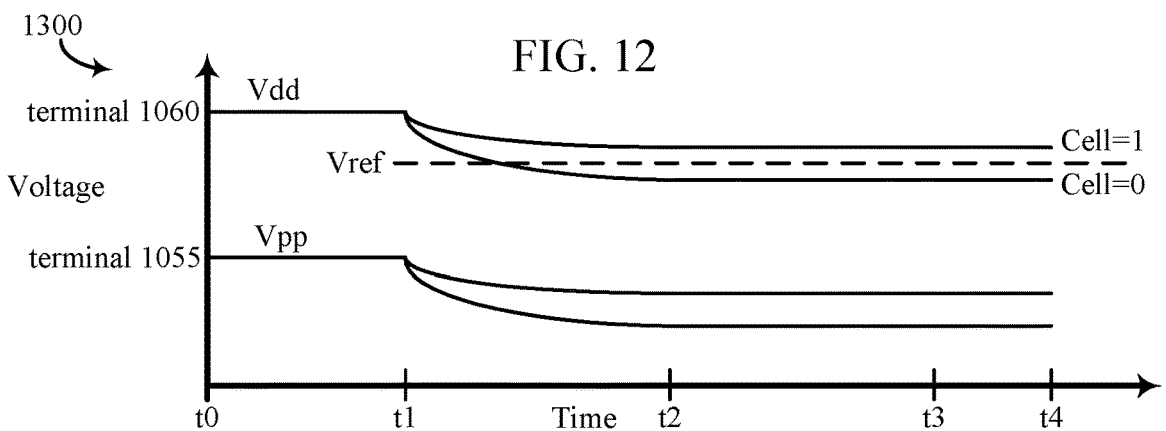
FIG. 13 shows an illustrative example of a time plot of voltages at terminals of a capacitor in accordance with embodiments of the present disclosure.

FIGS. 11-13 show a number of different graphical representations 1100, 1200, 1300 of voltages as functions over time present on the memory array 100 depicted in FIG. 10. Each of the graphical representations 1100, 1200, 1300 may be embodied as timing diagrams and are plotted over the same time period. In illustrative examples, the discharge circuit 1000 performs an access operation using two time periods to perform a number of functions. During a first time period (from t0 to t1), the discharge circuit 1000 discharges one or more residual charges from the common conductive line 405-b and its associated memory cells 415-b, 420-b. During the first time period, the shift capacitor 1065 is charged to be equal to the second voltage level Vdd. During a second time period (from t1 to t2), the charge stored on the targeted memory cell 415-b is transferred to the sense capacitor 515-*a*. In addition, during the second time period, the voltage present on the sense capacitor 515-*a* and the shift capacitor 1065 may be sensed by the latch 505-*a*. Finally, at t4, sometime after t2, a logic state of the targeted memory cell 415-*b* is determined by comparing the voltage received from the sense capacitor 515-*a* and the shift capacitor 1065 to a reference voltage (Vref). The functions and operations of the memory array 100 represented by the graphical representations 1100, 1200, 1300 may be controlled by the memory controller 140. FIG. 11 shows a graphical representation 1100 of voltages on a first common conductive line and a second common conductive line of a targeted memory cell 415-*b* during an access operation using the discharge circuit 1000 shown in FIG. 10. The operations depicted in FIG. 10 are similar to the operations depicted in FIG. 6. As such, a full description is not repeated here.

FIG. 12 shows a graphical representation 1200 of the gate voltages at each of the switching components 510-*a* of the discharge circuit 1000 shown in FIG. 10. In the illustrative embodiment, these gate voltages may be controlled by the memory controller 140. In other embodiments, the gate voltages may be controlled by another controller or computing device. The graphical representation 1200 depicts when particular switches are open and when they are closed during an access operation of the targeted memory cell 415-*b*. As used in graphical representation 1200, the term "closed" means that the switch is allowing its conductive line to conduct electricity and the term "open" means that the switch is not allowing its conductive to conduct electricity.

As already discussed, various functions of an access operation are performed during a number of different time periods. The specific operations of the switching components and other electronic components during each of the before-mentioned time periods will be described referring to FIGS. 12 and 13. FIG. 12 specifically refers to the operation of the plurality of switching components 510-*a* of the discharge circuit 1000. FIG. 13 depicts some results of operating those switching components. Consequently, FIG. 13 is introduced here, but used elsewhere to describe the results of opening and closing certain switching components. FIG. 13 shows a graphical representation 1300 of voltages at terminals of the shift capacitor 1065 shown in FIG. 10.

During the first time period (t041), the third switching component 1040 is opened while the first switching component 1030, the second switching component 1035, and the fourth switching component 1045 are closed. The first switching component 1030 connects first terminal 1055 to a first voltage source having a voltage level Vpp. Consequently, a voltage (e.g., Vpp) is applied to the common conductive line 405-*b* and one or more residual charges are discharged from the common conductive line 405-*b* and its associated memory cells 415-*b*, 420-*b*. In addition, the second switching component 1035 connects the second terminal 1060 to a second voltage supply having a second voltage level Vdd, where the first voltage level is different than the second voltage level. As shown in FIG. 8, during the first time period, the sense capacitor 515-*a* and the shift capacitor 1065 are charged using the first voltage source Vpp and the second voltage source Vdd.

Referring to FIG. 12, during the second time period (t1-t2), starting at t1, all of the switching components 510-*a* are changed. The third switching component 1040 is changed to the closed position while the first switching component 1030, the second switching component 1035, and the fourth switching component 1045 are changed to the opened position. At the same time, the word line of the targeted memory cell 415-*b* is selected. By doing this the latch 505-*a* is now connected to the second terminal 1060, while the first and second voltage source are disconnected from both of the first terminal 1055 and the second terminal 1060. In addition, the targeted memory cell 415-*b* is connected to the first terminal 1055. As shown in FIG. 13, by this, the charge stored on the ferroelectric capacitor of the targeted memory cell 415-*b* affects the voltage seen at the first terminal 1055 and the second terminal 1060. The reference voltage (Vref) applied to the latch 505-*a* is selected such that it may discriminate between logic states of the targeted memory cell 415-*b*. While not shown in FIGS. 11-13, at t4, which may occur sometime after t2, the latch 505-*a* is activated. Once activated, the latch 505-*a* stores the voltage seen at the second terminal 1060, compares that voltage to Vref, and determines the logic state of the targeted memory cell 415-*b*. In addition, the third switching component 1040 may be changed from the opened position to the closed position at some time after t2.

Figure 14:
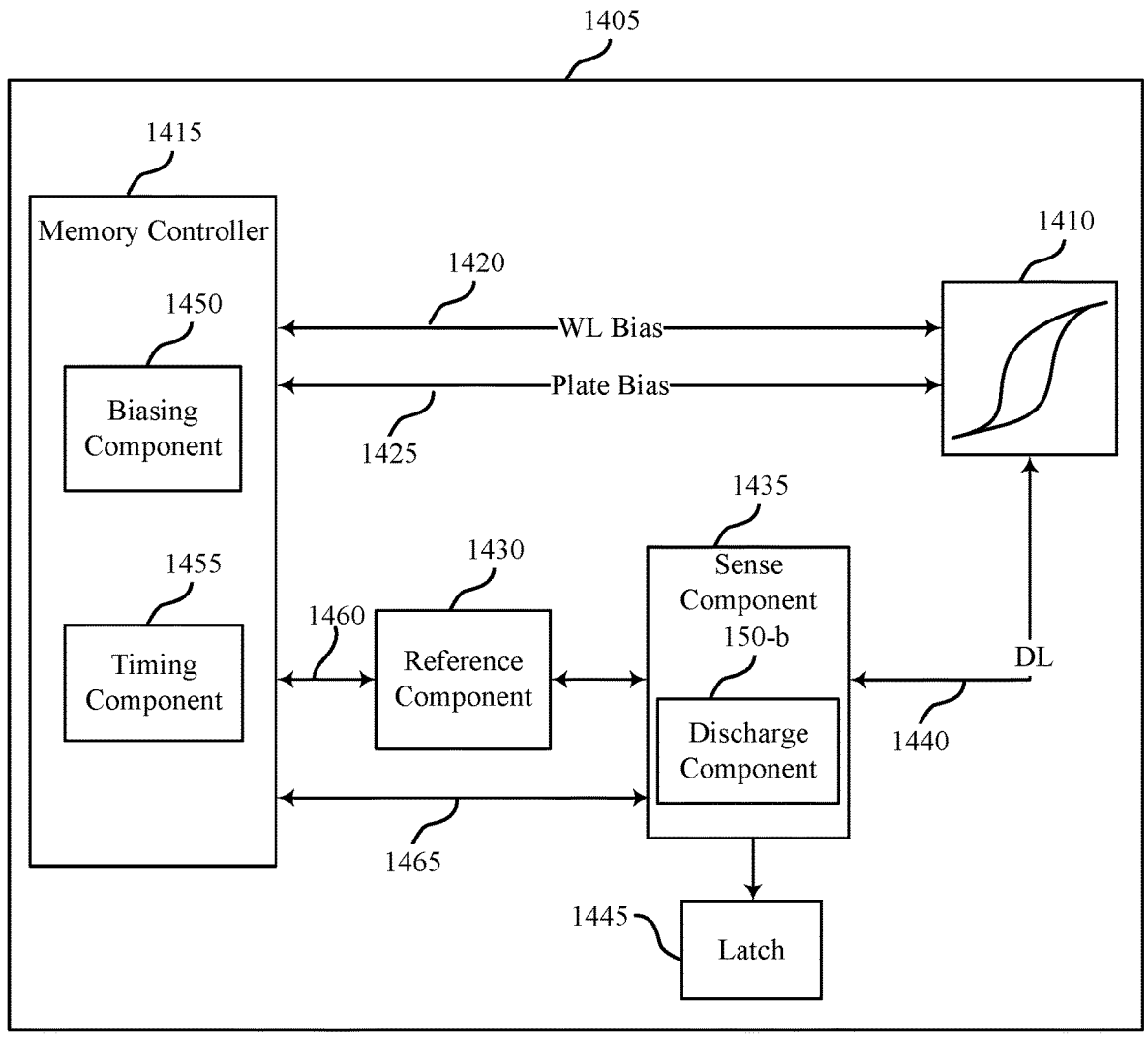
FIG. 14 illustrates a memory array that supports full bias sensing in a memory array in accordance with embodiments of the present disclosure.

FIG. 14 shows a block diagram 1400 of a memory array 1405 that supports full bias sensing in a memory array in accordance with various embodiments of the present disclosure. Memory array 1405 may be referred to as an electronic memory apparatus, and may be an example of a component of a memory array 100 as described with reference to FIG. 1.

Memory array 1405 may include one or more memory cells 1410, a memory controller 1415, a word line 1420, a plate line 1425, a reference component 1430, a sense component 1435, a digit line 1440, and a latch 1445. These components may be in electronic communication with each other and may perform one or more of the functions described herein. In some cases, memory controller 1415 may include biasing component 1450 and timing component 1455.

Memory controller 1415 may be in electronic communication with word line 1420, digit line 1440, sense component 1435, and plate line 1425, which may be examples of word line 110, digit line 115, sense component 125, and plate line 210 described with reference to FIGS. 1, and 2. Memory array 1405 may also include reference component 1430 and latch 1445. The components of memory array 1405 may be in electronic communication with each other and may perform portions of the functions described with reference to FIGS. 1 through 4. In some cases, reference component 1430, sense component 1435, and latch 1445 may be components of memory controller 1415. In other cases, the latch 1445 may be an example of latch 505 described with references to FIGS. 5 and 10.

In some examples, digit line 1440 is in electronic communication with sense component 1435 and a ferroelectric capacitor of ferroelectric memory cells 1410. A ferroelectric memory cell 1410 may be writable with a logic state (e.g., a first or second logic state). Word line 1420 may be in electronic communication with memory controller 1415 and a selection component of ferroelectric memory cell 1410. Plate line 1425 may be in electronic communication with memory controller 1415 and a plate of the ferroelectric capacitor of ferroelectric memory cell 1410. Sense component 1435 may be in electronic communication with memory controller 1415, digit line 1440, latch 1445, and reference line 1460. Reference component 1430 may be in electronic communication with memory controller 1415 via reference line 1460. Sense control line 1465 may be in electronic communication with sense component 1435 and memory controller 1415. These components may also be in electronic communication with other components, both inside and outside of memory array 1405, in addition to components not listed above, via other components, connections, or busses.

Memory controller 1415 may be configured to activate the word line 1420, plate line 1425, or digit line 1440 by applying voltages to those various nodes. For example, biasing component 1450 may be configured to apply a voltage to operate memory cell 1410 to read or write memory cell 1410 as described above. In some cases, memory controller 1415 may include a row decoder, column decoder, or both, as described with reference to FIG. 1. This may enable the memory controller 1415 to access one or more memory cells 105. Biasing component 1450 may also provide voltage potentials to reference component 1430 in order to generate a reference signal for sense component 1435. Additionally, biasing component 1450 may provide voltage potentials for the operation of sense component 1435.

In some cases, memory controller 1415 may perform its operations using timing component 1455. For example, timing component 1455 may control the timing of the various word line selections or plate biasing, including timing for switching and voltage application to perform the memory functions, such as reading and writing, discussed herein. In some cases, timing component 1455 may control the operations of biasing component 1450.

Reference component 1430 may include various components to generate a reference signal for sense component 1435. Reference component 1430 may include circuitry configured to produce a reference signal. In some cases, reference component 1430 may be implemented using other ferroelectric memory cells 105. Sense component 1435 may compare a signal from memory cell 1410 (through digit line 1440) with a reference signal from reference component 1430. Upon determining the logic state, the sense component may then store the output in latch 1445, where it may be used in accordance with the operations of an electronic device that memory array 1405 is a part. Sense component 1435 may include a sense amplifier in electronic communication with the latch and the ferroelectric memory cell.

Memory controller 1415 may be an example of embodiments of the memory controller 1515 described with reference to FIG. 15.

Memory controller 1415 may discharge during a first time period a residual charge from a middle electrode between a ferroelectric memory cell and a selection component that is coupled to an access line of the ferroelectric memory cell, charge after the first time period a capacitor that is in electronic communication with a digit line of the ferroelectric memory cell, determine a logic state of the ferroelectric memory cell based on a charge of the capacitor after the first time period, select a memory cell for an access operation, where the memory cell is in electronic communication with a digit line, charge a capacitor that is in electronic communication with the memory cell, where the capacitor is charged during a second time period that is after a first time period and a charge shared between the memory cell and the capacitor is based on a logic state of the memory cell, activate a switching component to couple the capacitor to a latch coupled to a second supply voltage that is less than a first supply voltage, and determine the logic state of the memory cell based on a voltage of the latch resulting from discharging the capacitor.

In some examples, the memory array 1405 may comprise a memory cell of a three-dimensional cross-point array, a plurality of switching components in electronic communication with the memory cell, a controller in electronic communication with the memory cell and the plurality of switching components, wherein the controller is operable to: discharge a residual charge from a middle electrode between the memory cell and a selection component coupled to an access line of the three-dimensional cross-point array; charge a capacitor that is in electronic communication with the memory cell via a digit line of the three-dimensional cross-point array after discharging the middle electrode; and determine a logic state of the memory cell based at least in part on a charge of the capacitor. In other examples, the memory array 1405 may be a two-dimensional memory array.

Figure 15:
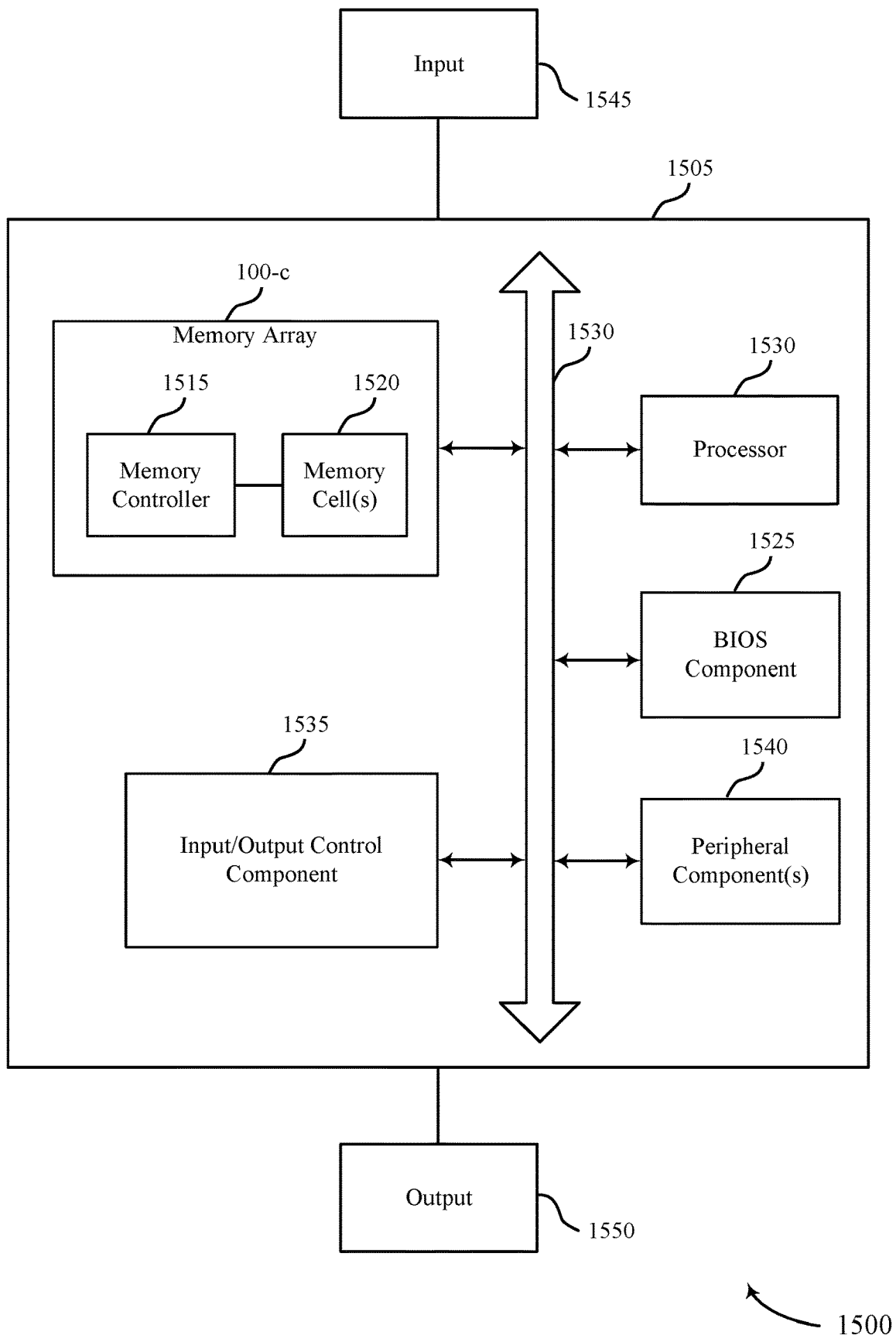
FIG. 15 illustrates a block diagram of a system including a memory array that supports full bias sensing in a memory array in accordance with embodiments of the present disclosure.

FIG. 15 shows a diagram of a system 1500 including a device 1505 that supports full bias sensing in a memory array in accordance with various embodiments of the present disclosure. Device 1505 may be an example of or include the components of a memory array 100 as described above, e.g., with reference to FIG. 1.

Device 1505 may include components for bi-directional voice and data communications including components for transmitting and receiving communications, including memory controller 1515, memory cells 1520, BIOS component 1525, processor 1530, I/O control component 1535, and peripheral components 1540.

Memory controller 1515 may operate one or more memory cells as described herein. Specifically, memory controller 1515 may be configured to support full bias sensing in a memory array. In some cases, memory controller 1515 may include a row decoder, column decoder, or both, as described with reference to FIG. 1.

Memory cells 1520 may store information (i.e., in the form of a logical state) as described herein.

BIOS component 1525 be a software component that includes a basic input/output system (BIOS) operated as firmware, which may initialize and run various hardware components. BIOS component 1525 may also manage data flow between a processor and various other components, e.g., peripheral components, input/output control component, etc. BIOS component 1525 may include a program or software stored in read-only memory (ROM), flash memory, or any other non-volatile memory.

Processor 1530 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 1530 may be configured to operate a memory array using a memory controller. In other cases, a memory controller may be integrated into processor 1530. Processor 1530 may be configured to execute computer-readable instructions stored in a memory to perform various functions (e.g., function or tasks supporting full bias sensing in a memory array). 1530.

Input/output (I/O) control component 1535 may manage input and output signals for device 1505. Input/output control component 1535 may also manage peripherals not integrated into device 1505. In some cases, input/output control component 1535 may represent a physical connection or port to an external peripheral. In some cases, I/O control component 1535 may utilize an operating system such as iOS®, ANDROID®, MS-DOS®, MS-WINDOWS®, OS/2®, UNIX®, LINUX®, or another known operating system.

Peripheral components 1540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1545 may represent a device or signal external to device 1505 that provides input to device 1505 or its components. This may include a user interface or an interface with or between other devices. In some cases, input 1545 may be managed by I/O control component 1535, and may interact with device 1505 via a peripheral component 1540.

Output 1550 may also represent a device or signal external to device 1505 configured to receive output from device 1505 or any of its components. Examples of output 1550 may include a display, audio speakers, a printing device, another processor or printed circuit board, etc. In some cases, output 1550 may be a peripheral element that interfaces with device 1505 via peripheral component(s) 1540. In some cases, output 1550 may be managed by I/O control component 1535.

The components of device 1505 may include circuitry designed to carry out their functions. This may include various circuit elements, for example, conductive lines, transistors, capacitors, inductors, resistors, amplifiers, or other active or inactive elements, configured to carry out the functions described herein.

Figure 16:
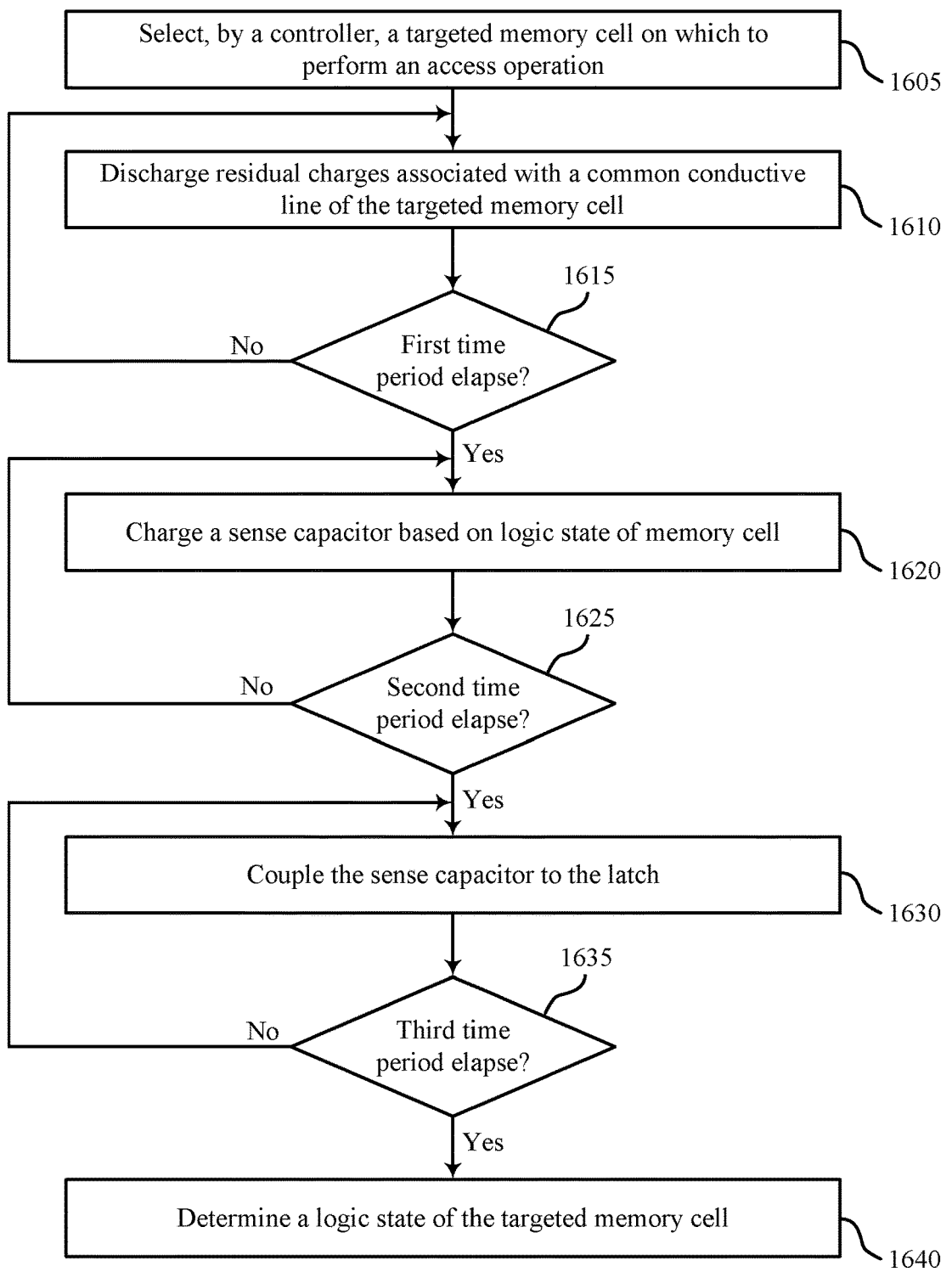
FIG. 16 illustrates an exemplary method for full bias sensing in a memory array in accordance with embodiments of the present disclosure.

FIG. 16 shows a flowchart illustrating a method 1600 for full bias sensing in a memory array in accordance with various embodiments of the present disclosure. The operations of method 1600 may be implemented by a memory array 100 or its components as described herein. For example, the operations of method 1600 may be performed by a memory controller as described with reference to FIGS. 1, 14, and 15. In some examples, a memory array 100 may execute a set of codes to control the functional elements of the device to perform the functions described below. Additionally or alternatively, the memory array 100 may perform portions of the functions described below using special-purpose hardware.

At block 1605, the method 1600 may include selecting a targeted memory cell on which to perform an access operation. This initial selection may be different than actually selecting the targeted memory cell by applying voltages to the digit line and the word line. Instead, this selection process may be done by a memory controller, prior to physically selecting the targeted memory cell. An access operation may include a write operation, a read operation, a refresh operation, or any other type of operation that may be performed using a memory cell. In some cases, the memory cell selected for the access operation is in electronic communication with a digit line. The actions at block 1605 may be performed by a discharge circuit or a memory controller as described with reference to FIGS. 1, 14, and 15.

At block 1610, the method 1600 may discharge during a first time period a residual charge from a middle electrode between a ferroelectric memory cell and a selection component that is coupled to an access line of the ferroelectric memory cell. Performing access operations on memory cells may cause residual charges to be built up on a common conductive line and the memory cells associated with the common conductive line. During an access operation on a targeted memory cell, those residual charges may contribute to the signal output from the targeted memory cell. In some instances, the contributions of the residual charges may introduce errors into the data stored on the targeted memory cell or may cause the memory array 100 to misinterpret the logic state stored on the targeted memory cell.

In some cases, discharging may include discharging a plurality of residual charges present on the common conductive line (e.g., a digit line) and on the middle electrodes of the memory cells electronically connected to the common conductive line. In some cases, the method 1600 may discharge during the first time period another residual charge from another middle electrode positioned between another ferroelectric memory cell that is in electronic communication with the digit line and another selection component coupled to another access line. The term "access line" may be used interchangeably with the term "common conductive line," "word line," "digit line," "bit line," or other similar nomenclature. In some cases, the memory array may discharge a residual charge associated with the memory cell during the first time period and based at least in part on selecting the memory cell. In some cases, the memory cell is a first memory cell of a plurality of memory cells, and wherein the residual charge is associated with a prior access operation for the first memory cell or a second memory cell of the plurality of memory cells. In some cases, the memory cell is coupled to a selection component via a middle electrode, and wherein the residual charge is stored at the middle electrode. More specifically, residual charges may build up in the middle electrode of the memory cells coupled to the common conductive line. The actions at block 1610 may be performed by a discharge circuit or a memory controller as described with reference to FIGS. 1, 14, and 15.

At block 1615, the method 1600 may determine whether the first time period has elapsed. If the first time period has not elapsed, the method 1600 may return to block 1610 and continue to discharge the residual charges. If the first time period has elapsed, the method 1600 may perform block 1620. The actions at block 1615 may be performed by a discharge circuit or a memory controller as described with reference to FIGS. 1, 14, and 15.

At block 1620, the method 1600 may charge after the first time period a capacitor that is in electronic communication with a digit line of the ferroelectric memory cell. In some cases, the first capacitor is the sense capacitor and it is charged during the second time period. As part of the charging, the memory array may activate for the second time period a switching component that couples the capacitor to the ferroelectric memory cell via the digit line, wherein the second time period is after the first time period. In addition, the amplifier in the discharge circuit may amplify an output of the ferroelectric memory cell during the second time period, wherein the logic state of the ferroelectric memory cell is determined based at least in part on the amplified output. For example, the output of the memory cell may be amplified as it is transferred to the sense capacitor.

In some cases, the method 1600 may charge the capacitor, which is in electronic communication with the memory cell, wherein the capacitor is charged during the second time period that is after the first time period and a charge shared between the memory cell and the capacitor is based at least in part on a logic state of the memory cell. During the second time period, the method 1600 may activate during the second time period a switching component that couples the capacitor to the memory cell via the digit line. In some cases, the method 1600 may also isolate the capacitor from a first voltage supply. The actions at block 1620 may be performed by a discharge circuit or a memory controller as described with reference to FIGS. 1, 14, and 15.

At block 1625, the method 1600 may determine whether the second time period has elapsed. If the second time period has not elapsed, the method 1600 may return to block 1620 and continue to charge the sense capacitor. If the second time period has elapsed, the method 1600 may perform block 1630. The actions at block 1625 may be performed by a discharge circuit or a memory controller as described with reference to FIGS. 1, 14, and 15.

At block 1630, the method 1600 may activate a switching component to couple the capacitor to a latch coupled to a second supply voltage that is less than a first supply voltage. More specifically, the method 1600 may activate a first switching component to couple the capacitor to the latch, and activate a second switching component to virtually ground the capacitor. In this way, a first terminal of the capacitor is virtually grounded and the a second terminal of the capacitor is left floating. Due to this configuration, the voltage seen on the second terminal may be indicative of the charge of the sense capacitor, and, by extension, be indicative of the logic state of the memory cell.

In some cases, the method 1600 may activate for a third time period a switching component that couples the capacitor to a latch, wherein the third time period is after the second time period and the latch is coupled to a supply voltage that is lower than the supply voltage for a group of memory cells that includes the ferroelectric memory cell. In some cases, the method 1600 may isolate the capacitor from the ferroelectric memory cell during the third time period. The actions at block 1630 may be performed by a discharge circuit or a memory controller as described with reference to FIGS. 1, 14, and 15.

At block 1635, the method 1600 may determine whether the third time period has elapsed. If the third time period has not elapsed, the method 1600 may return to block 1630 and continue to couple the sense capacitor to the latch. If the third time period has elapsed, the method 1600 may perform block 1640. The actions at block 1635 may be performed by a discharge circuit or a memory controller as described with reference to FIGS. 1, 14, and 15.

At block 1640, the method 1600 may determine a logic state of the ferroelectric memory based at least in part on a charge of the capacitor (e.g., the sense capacitor) after the first time period. In some cases, the method 1600 may determine the logic state during the third time period. As discussed above, the voltage on the second terminal of the sense capacitor may be indicative of the charge present on the targeted memory cell. The voltage level of the reference voltage is selected based at least in part on the expected values on the second terminal depending on the logic states of the memory cell. The method 1600 may compare the output of the sense capacitor to a reference voltage to determine the logic state of memory cell. In some cases, the method 1600 may determine the logic state of the memory cell based at least in part on a voltage of the latch resulting from coupling the capacitor to the latch. The actions at block 1640 may be performed by a discharge circuit or a memory controller as described with reference to FIGS. 1, 14, and 15.

Figure 17:
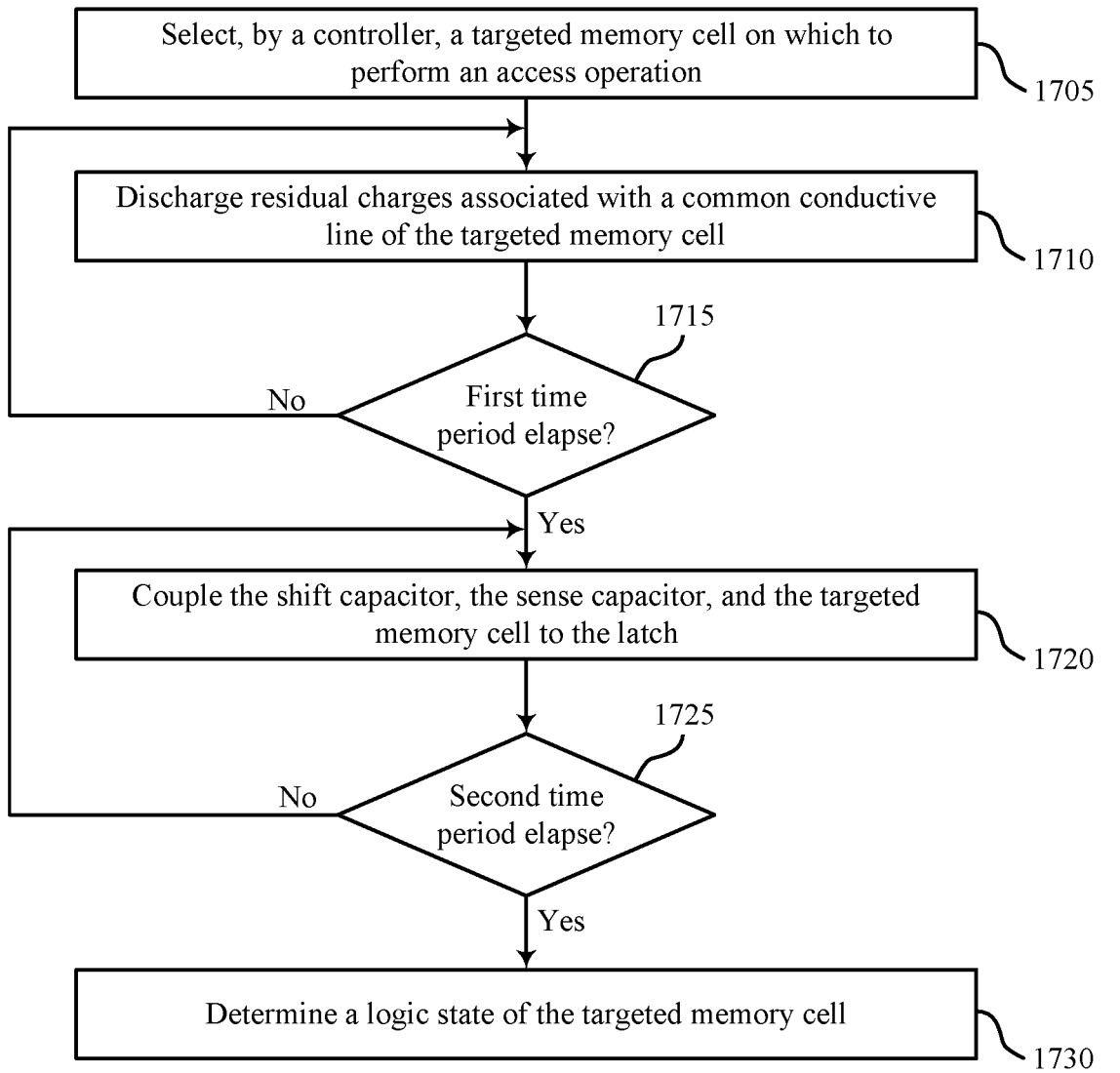
FIG. 17 illustrates an exemplary method for full bias sensing in a memory array in accordance with embodiments of the present disclosure.

FIG. 17 shows a flowchart illustrating a method 1700 for full bias sensing in a memory array in accordance with various embodiments of the present disclosure. The operations of method 1700 may be implemented by a memory array 100 or its components as described herein. For example, the operations of method 1700 may be performed by a memory controller as described with reference to FIGS. 1, 14, and 15. In some examples, a memory array 100 may execute a set of codes to control the functional elements of the device to perform the functions described below. Additionally or alternatively, the memory array 100 may perform portions of the functions described below using special-purpose hardware.

At block 1705, the method 1700 may select a targeted memory cell on which to perform an access operation. This initial selection may be different than actually selecting the targeted memory cell by applying voltages to the digit line and the word line. Instead, this selection process may be done by the memory controller, prior to physically selecting the targeted memory cell. An access operation may include a write operation, a read operation, a refresh operation, or any other type of operation that may be performed using a memory cell. In some cases, the memory cell selected for the access operation is in electronic communication with a digit line. The actions at block 1705 may be performed by a discharge circuit or a memory controller as described with reference to FIGS. 1, 14, and 15.

At block 1710, the method 1700 may discharge during a first time period a residual charge from a middle electrode between a ferroelectric memory cell and a selection component that is coupled to an access line of the ferroelectric memory cell. Performing access operations on memory cells may cause residual charges to be built up on a common conductive line and the memory cells associated with the common conductive line. During an access operation on a targeted memory cell, those residual charges may contribute to the signal output from the targeted memory cell. In some instances, the contributions of the residual charges may introduce errors into the data stored on the targeted memory cell or may cause the memory array 100 to misinterpret the logic state stored on the targeted memory cell.

In some cases, the method 1700 may charge during the first time period an additional capacitor that may be in electronic communication with the digit line. In these examples, the additional capacitor may be a shift capacitor and may be used to alter the output voltage of the sense capacitor, as seen by the latch. In illustrative examples, the shift capacitor may alter the voltage to be more suited to be input into the latch. Normally, the voltage and charge on the sense capacitor may be dictated by the operational needs of the discharge circuit. In some cases, the method 1700 may charge a second capacitor that is in electronic communication with the first capacitor and the latch. In some cases, the method 1700 may activate the switching component to couple the first capacitor and the second capacitor to the latch. The actions at block 1710 may be performed by a discharge circuit or a memory controller as described with reference to FIGS. 1, 14, and 15.

At block 1715, the method 1700 may determine whether the first time period has elapsed. If the first time period has not elapsed, the method 1700 may return to block 1710 and continue to discharge the residual charges and/or charge the additional capacitor. If the first time period has elapsed, the method 1700 may perform block 1720. The actions at block 1715 may be performed by a discharge circuit or a memory controller as described with reference to FIGS. 1, 14, and 15.

At block 1720, the method 1700 may activate one or more switching components to couple the shift capacitor, the sense capacitor, and the targeted memory cell to the latch. In some cases, a first terminal of the shift capacitor is disconnected from a first voltage supply and a second terminal of the shift capacitor is disconnected from a second voltage supply. In this way, the targeted memory cell, the sense capacitor, and the shift capacitor are all connected to the first terminal and the second terminal of the shift capacitor is connected to the latch. The voltage seen at the second terminal of the shift capacitor may be indicative of the logic state stored on the targeted memory cell. The actions at block 1720 may be performed by a discharge circuit or a memory controller as described with reference to FIGS. 1, 14, and 15.

At block 1725, the method 1700 may determine whether the second time period has elapsed. If the second time period has not elapsed, the method 1700 may return to block 1720 and continue to couple the electronic components to the latch. If the second time period has elapsed, the method 1700 may perform block 1730. The actions at block 1725 may be performed by a discharge circuit or a memory controller as described with reference to FIGS. 1, 14, and 15.

At block 1730, the method 1700 may determine a logic state of the ferroelectric memory based at least in part on a charge of the sense capacitor and the shift capacitor after the first time period. In some cases, the method 1700 may determine the logic state during the second time period. As discussed above, the voltage on the second terminal of the shift capacitor may be indicative of the charge present on the targeted memory cell. The voltage level of the reference voltage is selected based at least in part on the expected values on the second terminal depending on the logic states of the memory cell. The method 1700 may compare the output of the shift capacitor and the sense capacitor to a reference voltage to determine the logic state of targeted memory cell. The actions at block 1730 may be performed by a discharge circuit or a memory controller as described with reference to FIGS. 1, 14, and 15.

Thus, methods 1600 and 1700 may provide for full bias sensing in a memory array to prevent the corruption of logic values of memory cells or to prevent the corruption of the interpretation of logic values stored on memory cells. Methods 1600 and 1700 may thus be methods of operating a memory array that comprises a ferroelectric memory cell in electronic communication with a selection component or may be methods of operating a plurality of ferroelectric memory cells. It should be noted that methods 1600 and 1700 describe possible implementations, and the operations and steps may be rearranged or otherwise modified such that other implementations are possible. In some examples, portions from the methods 1600 and 1700 may be combined.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication" and "couple" or "coupled" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). A switch, for example, that couples other components may facilitate electronic communication between the coupled components.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    discharging, during a first time period of a read operation, one or more residual charges from a digit line coupled with a memory cell;
    transferring, during a second time period of the read operation, a charge stored on the memory cell to a first capacitor and a second capacitor coupled with the digit line;
    coupling the first capacitor and the second capacitor with a latch based at least in part on transferring the charge, wherein the latch is coupled with a second voltage supply;
    adjusting, by the second capacitor, a voltage output by the first capacitor from a first value to a second value that is a same value as the second voltage supply coupled with the latch during the read operation;
    receiving, during a third time period of the read operation, a charge state associated with the first capacitor and the second capacitor at the latch based at least in part on the coupling; and
    determining a logic state of the memory cell based at least in part on the charge state.

2. The method of claim 1, further comprising:
    adjusting, by the second capacitor, a voltage output received by the latch from a first value to a second value during the read operation.

3. The method of claim 1, wherein the second capacitor is configured to shift a voltage output of the first capacitor.

4. The method of claim 1, further comprising:
    coupling the first capacitor and the second capacitor with the digit line, wherein transferring the charge is based at least in part on coupling the first capacitor and the second capacitor with the digit line.

5. The method of claim 4, further comprising:
activating a switching component to couple the first capacitor and the second capacitor with the digit line.

6. The method of claim 1, wherein the second voltage supply is lower than a first voltage supply, the first voltage supply coupled with the first capacitor and the second capacitor.

7. The method of claim 1, wherein coupling the first capacitor and the second capacitor with the latch indicates to the latch the charge state associated with the memory cell.

8. The method of claim 1, wherein determining the logic state of the memory cell comprises:
comparing a voltage received from the first capacitor with a reference voltage.

9. A method, comprising:
activating, during a first time period, a first switching component to couple a first terminal of a first capacitor and a second terminal of a second capacitor with a first voltage source;
activating, during the first time period, a second switching component to couple a third terminal of the first capacitor with a fourth terminal of the second capacitor;
activating, during the first time period, a third switching component to couple a memory cell with the first terminal and the second terminal;
activating, during a second time period after the first time period, a fourth switching component to couple the fourth terminal of the second capacitor with a latch;
deactivating, during the second time period, the first switching component, the second switching component, and the third switching component; and
determining a logic state of the memory cell based at least in part on activating the fourth switching component and deactivating the first switching component, the second switching component, and the third switching component.

10. The method of claim 9, wherein the third switching component is coupled with a second voltage source having a voltage different than a voltage of the first voltage source.

11. The method of claim 9, wherein coupling the latch with the fourth terminal occurs concurrently with isolating the first voltage source from the first terminal and the second terminal.

12. The method of claim 9, further comprising:
selecting a word line, wherein coupling the memory cell with the first terminal and the second terminal is based at least in part on selecting the word line.

13. The method of claim 9, further comprising:
activating, during a third time period, the latch to compare a voltage of the fourth terminal with a reference voltage.

14. The method of claim 9, further comprising:
charging, during the first time period, the first capacitor and the second capacitor based at least in part on activating the first switching component, the second switching component, and the third switching component.

15. The method of claim 9, wherein the second capacitor is configured to shift a voltage output of the first capacitor.

16. A device, comprising:
a memory cell;
a first capacitor configured to receive a charge from the memory cell and output a first voltage; and
a second capacitor coupled with the first capacitor and configured to shift a voltage output by the first capacitor to a second voltage that has a same value as a second voltage supply coupled with a latch.

17. The device of claim 16, wherein a first terminal of the second capacitor is selectively couplable with a common conductive line associated with the memory cell and a first voltage supply that is higher than the second voltage supply coupled with the latch.

18. The device of claim 17, wherein the first terminal of the second capacitor is coupled with a first terminal of the first capacitor.

19. The device of claim 18, wherein a second terminal of the second capacitor is selectively couplable with a second terminal of the first capacitor using a switching component.

\* \* \* \* \*